United States Patent
Marumo et al.

(10) Patent No.: US 6,926,817 B2
(45) Date of Patent: Aug. 9, 2005

(54) SOLUTION PROCESSING APPARATUS AND SOLUTION PROCESSING METHOD

(75) Inventors: Yoshinori Marumo, Nirasaki (JP); Koichiro Kimura, Tsukui-gun (JP)

(73) Assignee: Tokyo Electron Limited, Tokyo (JP)

( * ) Notice: Subject to any disclaimer, the term of this patent is extended or adjusted under 35 U.S.C. 154(b) by 381 days.

(21) Appl. No.: 10/143,014

(22) Filed: May 13, 2002

(65) Prior Publication Data

US 2002/0166575 A1 Nov. 14, 2002

(30) Foreign Application Priority Data

May 11, 2001 (JP) .................................... P2001-141465

(51) Int. Cl.[7] .............................. C25D 5/00; C25D 17/00
(52) U.S. Cl. ..................... 205/118; 205/133; 204/198; 204/212; 204/224 R
(58) Field of Search .............................. 204/198, 212, 204/224 R; 205/118, 133

(56) References Cited

U.S. PATENT DOCUMENTS

| | | | | | |
|---|---|---|---|---|---|
| 6,099,702 | A | * | 8/2000 | Reid et al. ................... | 204/212 |
| 6,156,167 | A | * | 12/2000 | Patton et al. ............... | 204/270 |
| 6,179,982 | B1 | * | 1/2001 | Ting et al. .................... | 205/80 |
| 6,309,520 | B1 | * | 10/2001 | Woodruff et al. ........... | 204/242 |
| 6,334,937 | B1 | * | 1/2002 | Batz et al. ................... | 204/212 |
| 2002/0020622 | A1 | * | 2/2002 | Hanson et al. .............. | 204/222 |

* cited by examiner

Primary Examiner—Arun S. Phasge
(74) Attorney, Agent, or Firm—Pillsbury Winthrop Shaw Pittman LLP

(57) ABSTRACT

A plating apparatus includes a plating solution tank which stores a plating solution, a holder including an inner space to house a wafer and an opening for the wafer to be in contact with the plating solution, and a nitrogen supplying mechanism to supply nitrogen to the inner space of the holder.

13 Claims, 22 Drawing Sheets

(III)
(iii)

(III)
(iii)

(II)
(iii)

(II)
(iii)

(I)(iii)

(I)(iii)

(I)(ii)

(I)(ii)

FIG. 5M
FIG. 5N
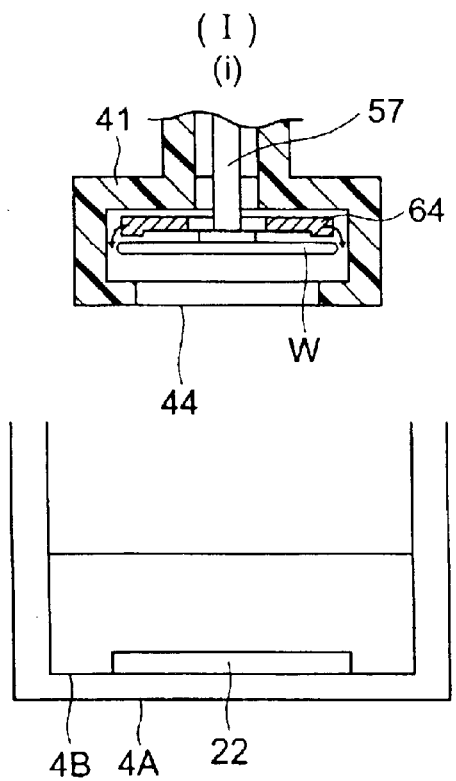
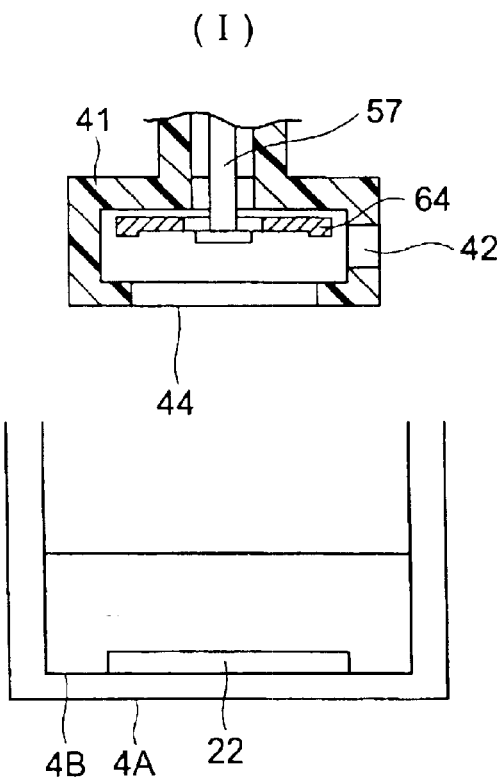

SOLUTION PROCESSING APPARATUS AND SOLUTION PROCESSING METHOD

BACKGROUND OF THE INVENTION

1. Field of the Invention

The present invention relates to a solution processing apparatus and a solution processing method for performing solution processing on a substrate such as a semiconductor wafer.

2. Description of the Related Art

As an apparatus for forming a metal layer on a surface of a semiconductor wafer (hereinafter, simply called "the wafer"), for example, a physical vapor deposition apparatus (PVD apparatus) by which a metal layer is formed with a vapor phase is conventionally used. Recently, however, use of a plating apparatus for forming a metal layer with a liquid phase becomes a mainstream in terms of a film-forming speed.

FIG. 19 is a vertical sectional view schematically showing a conventional plating apparatus. As shown in FIG. 19, a plating apparatus 200 is mainly composed of a plating solution tank 201 housing a plating solution and a holder 202 for holding a wafer W. To apply plating to the wafer W in the plating apparatus 200, the holder 202 holding the wafer W is lowered first, and the wafer W is brought into contact with the plating solution inside the plating solution tank 201. Thereafter, voltage is applied between an anode electrode 203 placed inside the plating solution tank 201 and a cathode electrode 204 placed in an inner space of the holder 202.

Incidentally, a chuck member 205 for sucking a backside of the wafer W to raise and lower the wafer W relative to the holder 202 is placed inside the holder 202. By raising and lowering the chuck member 205, the wafer W can be located at a predetermined position inside the holder 202.

However, when the holder 202 is raised to separate the wafer W from the plating solution after plating is applied to the wafer W, the plating solution remains at a contact portion of the wafer W and the holder 202. In this state, if the wafer W is raised by means of the chuck member 205 and thereby the wafer W is separated from the holder 202, a liquid film of the plating solution is sometimes formed between the wafer W and the holder 202. When this liquid film breaks, the plating solution scatters in the space inside the holder 202, which causes the contamination of the wafer W.

SUMMARY OF THE INVENTION

In order to attain the above-described object, it is an object of the present invention to provide a solution processing apparatus and a solution processing method capable of reducing contamination of a substrate.

A solution processing apparatus of the present invention comprises a processing solution tank to store a processing solution, a holder having an inner space to house a substrate and an opening for the substrate to be in contact with the processing solution, a holder raising and lowering mechanism to raise and lower the holder with respect to the processing solution tank, a substrate raising and lowering mechanism to hold the substrate housed in the inner space of the holder and raise and lower the substrate with respect to the holder, a first electrode which is placed in the inner space of the holder and configured to be in contact with the substrate, a second electrode between which and the first electrode voltage is applied, and a pressurizing mechanism to raise pressure in the inner space of the holder. Since the solution processing apparatus of the present invention includes the pressurizing mechanism as described above, it becomes difficult for a liquid film of the processing solution to be formed between the substrate and the holder. Even when the liquid film of the processing solution is formed between the substrate and the holder, it is possible to break the liquid film of the processing solution toward the opening from the inner space of the holder. Therefore, the processing solution scattering toward the inner space of the holder can be reduced, and contamination of the substrate can be reduced. Corrosion of the first electrode can be reduced.

Another solution processing apparatus of the present invention comprises a processing solution tank to store a processing solution, a holder having an inner space to house a substrate and an opening for the substrate to be in contact with the processing solution, a holder raising and lowering mechanism to raise and lower the holder with respect to the processing tank, a substrate raising and lowering mechanism to hold the substrate housed in the inner space of the holder and raise and lower the substrate with respect to the holder, a first electrode which is placed in the inner space of the holder and configured to be in contact with the substrate, a second electrode between which and the first electrode voltage is applied, and a fluid spraying mechanism to spray fluid to a contact portion of the substrate and the holder from an outside of the holder. Since the solution processing apparatus of the present invention includes the fluid spraying mechanism as above, it is difficult for the liquid film of the processing solution to be formed between the substrate and the holder. Therefore, the processing solution scattering to the inner space of the holder can be reduced, and contamination of the substrate can be reduced. Corrosion of the first electrode can be reduced.

Another solution processing apparatus of the present invention comprises a processing solution tank to store a processing solution, a holder having an inner space to house a substrate and an opening for the substrate to be in contact with the processing solution, a holder raising and lowering mechanism to raise and lower the holder with respect to the processing solution tank, a first electrode which is placed in the inner space of the holder and configured to be in contact with the substrate, a second electrode between which and the first electrode voltage is applied, and a substrate raising and lowering mechanism to hold the substrate housed in the inner space of the holder, and raise and lower, and rotate the substrate with respect to the holder. Since the solution processing apparatus of the present invention includes the substrate raising and lowering mechanism as described above, it is possible to break the liquid film of the processing solution in a state in which a scattering force is small even when the liquid film of the processing solution is formed between the substrate and the holder. Therefore, the processing solution scattering to the inner space of the holder can be reduced and contamination of the substrate can be reduced. Further, corrosion of the first electrode can be also reduced.

It is preferable that the above-described pressurizing mechanism is a gas supplying mechanism to supply a gas to the inner space of the holder. By using the gas supplying mechanism, the processing solution scattering to the inner space of the holder can be surely reduced.

It is possible to use a gas spraying mechanism to spray a gas to the contact portion as the above-described fluid spraying mechanism. By using the gas spraying mechanism, the processing solution existing at the contact portion can be blown off.

It is possible to use a liquid spraying mechanism to spray liquid to the contact portion as the above-described fluid spraying mechanism. By using the liquid spraying mechanism, the processing solution existing at the contact portion can be replaced with liquid.

It is possible to use a plating solution as the above-described processing solution. By using the plating solution, plating can be applied to the substrate.

A solution processing method of the present invention comprises a solution processing step of feeding an electric current to a substrate and performing solution processing for the substrate in a state in which the substrate is housed in an inner space of a holder so as to close an opening of the holder and the substrate is in contact with a processing solution, a processing solution separating step of separating the substrate for which the solution processing is performed from the processing solution after performing the solution processing for the substrate, a holder separating step of separating the substrate from the holder after separating the substrate for which the solution processing is performed from the processing solution, and a liquid film breaking step of breaking a liquid film of the processing solution formed between the substrate and the holder in a state in which pressure of the inner space of the holder is higher than pressure outside the holder, after separating the substrate from the holder. The solution processing method of the present invention includes the liquid film breaking step as described above, and therefore the liquid film of the aforementioned processing solution can be broken toward the aforementioned opening from the inner space of the holder. Therefore, the processing solution scattering to the inner space of the aforementioned holder can be reduced, and contamination of the substrate can be reduced.

Another solution processing method of the present invention comprises a solution processing step of feeding an electric current to a substrate and performing solution processing for the substrate in a state in which the substrate is housed in an inner space of a holder so as to close an opening of the holder and the substrate is in contact with a processing solution, a processing solution separating step of separating the substrate for which the solution processing is performed from the processing solution after the solution processing is performed for the substrate, and a holder separating step of separating the substrate from the holder in a state in which pressure of the inner space of the holder is higher than pressure of an outside of the aforementioned holder, after separating the substrate for which the solution processing is performed from the processing solution. Since the solution processing method of the present invention includes the holder separating step as described above, it becomes difficult for a liquid film to be formed between the substrate and the holder. Even when the liquid film of the processing solution is formed between the substrate and the holder, it is possible to break the liquid film of the processing solution toward the opening from the inner space of the holder. Therefore, the processing solution scattering to the inner space of the holder can be reduced and contamination of the substrate can be reduced.

Another solution processing method of the present invention comprises a solution processing step of feeding an electric current to a substrate and performing solution processing for the substrate in a state in which the substrate is housed in an inner space of a holder so as to close an opening of the holder and the substrate is in contact with a processing solution, a processing solution separating step of separating the substrate for which the solution processing is performed from the processing solution after performing the solution processing for the substrate, a fluid spraying step of spraying fluid to a contact portion of the substrate for which the solution processing is performed and the holder from an outside of the holder after separating the substrate for which the solution processing is performed from the processing solution, and a holder separating step of separating the substrate from the holder after spraying the fluid thereto. Since the solution processing method of this invention includes the fluid spraying step as described above, it becomes difficult for a liquid film of the processing solution to be formed between the substrate and the holder. Therefore, the processing solution scattering to the inner space of the holder can be reduced, and contamination of the substrate can be reduced.

Another solution processing method of the present invention comprises a solution processing step of feeding an electric current to a substrate and performing solution processing for the substrate in a state in which the substrate is housed in an inner space of a holder so as to close an opening of the holder and the substrate is in contact with a processing solution, a processing solution separating step of separating the substrate for which the solution processing is performed from the processing solution after performing the solution processing for the substrate, and a holder separating step of separating the substrate for which the solution processing is performed from the holder while rotating the substrate, for which the solution processing is performed, relative to the holder after separating the substrate for which the solution processing is performed from the processing solution. Since the solution processing method of the present invention includes the holder separating step, it is possible to break the liquid film of the processing solution in a state in which the scattering force is small. Therefore, the processing solution scattering to the inner space of the holder can be reduced, and contamination of the substrate can be reduced.

The above-described fluid spraying step can be a step of spraying a gas to the contact portion. By spraying a gas to the contact portion, the processing solution existing at the contact portion can be blown off.

The above-described fluid spraying step can be a step of spraying liquid to the contact portion. By spraying liquid to the contact portion, the processing solution existing at the contact portion can be replaced with liquid.

DETAILED DESCRIPTION OF THE INVENTION (First Embodiment)

Figure 1:
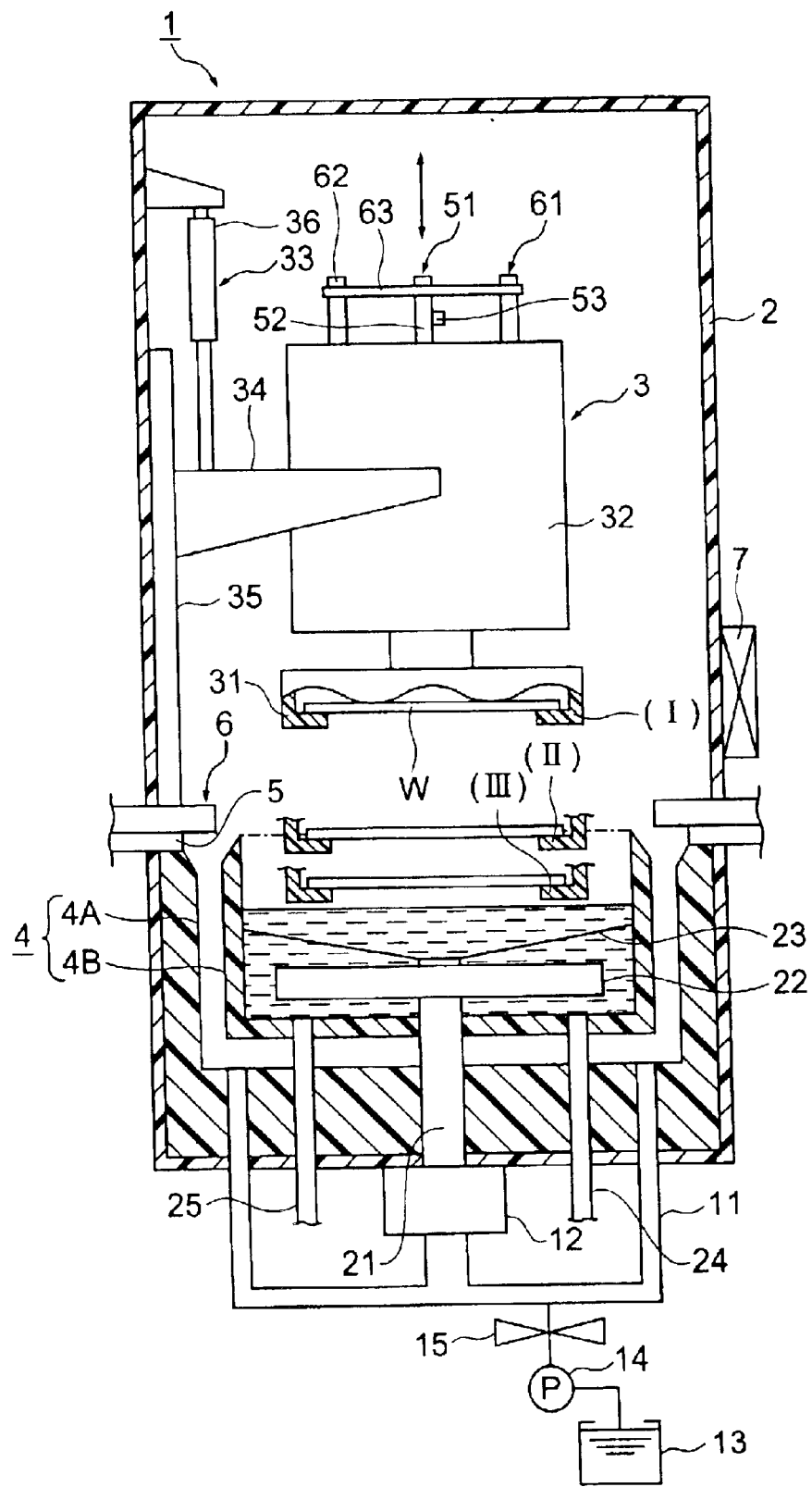
FIG. 1 is a schematic vertical sectional view of a plating apparatus according to a first embodiment.
Figure 2:
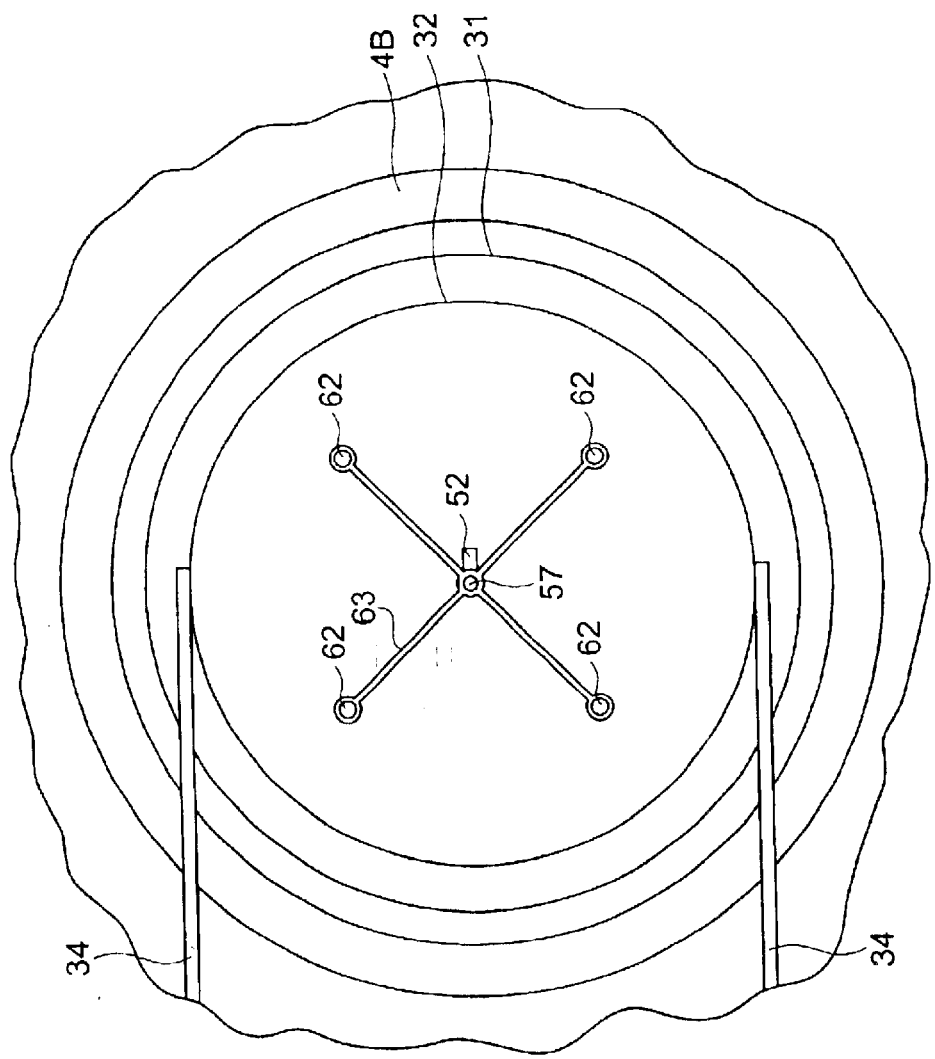
FIG. 2 is a plan view schematically showing an inside of the plating apparatus according to the first embodiment.

A plating apparatus according to a first embodiment of the present invention will be explained. FIG. 1 is a schematic vertical sectional view of a plating apparatus according to this embodiment. FIG. 2 is a plan view schematically showing an inside of the plating apparatus according to the present embodiment and FIG. 3 is a schematic vertical sectional view of a holder according to the present embodiment.

Figure 3:
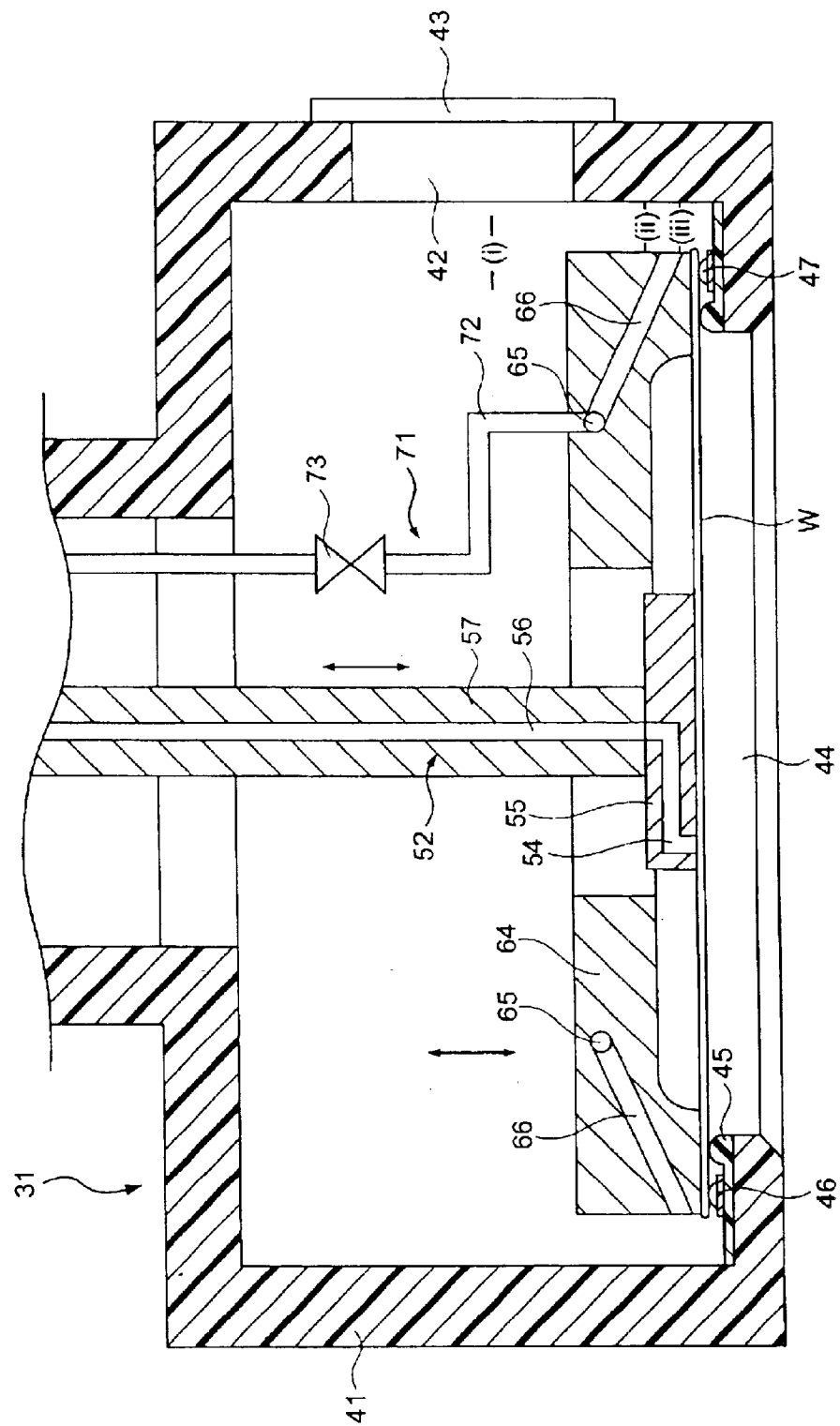
FIG. 3 is a schematic vertical sectional view of a holder according to the first embodiment.

As shown in FIG. 1 to FIG. 3, a plating apparatus 1 includes a housing 2 formed of synthetic resin. A driver 3 for holding a wafer W and a plating solution tank 4 (processing solution tank) for storing a plating solution are mainly placed inside the housing 2. In the present embodiment, the driver 3 is placed just above the plating solution tank 4.

A separator 6 including an exhaust port 5 therein is placed at a top of the plating solution tank 4. A gate valve 7 for transferring the wafer W into and out of the housing 2 is provided at the housing 2 near a transfer position (I) that will be described later.

The plating solution tank 4 is composed of, for example, an outer tank 4A and an inner tank 4B placed inside the outer tank 4A. The outer tank 4A is formed to be substantially a cylindrical form with a top surface being opened and a bottom surface being closed, and a pipe 11 is connected to a bottom of the outer tank 4A. A pump 12 is placed between the pipe 11 and a blowout pipe 21 that will be described later. By the operation of the pump 12, the plating solution discharged from the inner tank 4B and stored in the outer tank 4A is supplied to the inner tank 4B again. A tank 13 storing the plating solution is connected to the pipe 11 via a pump 14 and a valve 15. The pump 14 is operated and the valve 15 is opened, whereby the plating solution inside the tank 13 is supplied to the inner tank 4B.

The inner tank 4B is formed to be substantially a cylindrical form with a top surface being opened and a bottom surface being closed like the outer tank 4A. The blowout pipe 21 for blowing out the plating solution toward a top surface from a bottom surface of the inner tank 4B is protruded inside the inner tank 4B.

An anode electrode 22 (a second electrode) in a substantially disc form is placed around the blowout pipe 21. The anode electrode 22 is electrically connected to a power source not shown outside the housing 2.

A diaphragm 23 for partitioning the inner tank 4B into upper and lower parts is provided above the anode electrode 22 between an outer circumference of an end portion of the blowout pipe 21 and the inner tank 4B. The plating solution is supplied to the upper part of the inner tank 4B partitioned by the diaphragm 23 from the blowout pipe 21, and the plating solution is supplied to the lower part of the inner tank 4B partitioned by the diaphragm 23 from a circulation pipe 24 that will be described later. The diaphragm 23 is constructed so that ion is allowed to pass through it but impurities occurring when the anode electrode 22 is dissolved and bubbles such as, for example, oxygen and hydrogen occurring during plating processing are not allowed to pass through it.

Circulation pipes 24 and 25 are provided at the bottom of the inner tank 4B. A pump not shown is placed between the circulation pipes 24 and 25. By operating this pump, the plating solution is supplied from the circulation pipe 24 and the plating solution is discharged form the circulation pipe 25.

The driver 3 mainly includes a holder 31 for holding the wafer W, and a motor 32 for rotating the wafer W with the holder 31 within a substantially horizontal plane. A holder raising and lowering mechanism 33 for raising and lowering the holder 31 with respect to the plating solution tank 4 is attached to the motor 32. The holder raising and lowering mechanism 33 in this embodiment raises and lowers the holder 31 together with the driver 3.

The holder raising and lowering mechanism 33 is composed of, for example, a support beam 34 attached to the motor 32, a guide rail 35 attached at an inner wall of the housing 2, and a vertically extendable and contractible cylinder 36 for raising and lowering the support beam 34 along the guide rail 35. By driving the cylinder 36, the driver 3 supported by the support beam 34 is raised and lowered along the guide rail 35.

In concrete, a holder container 41 of the holder 31, which will be described later is raised and lowered between three positions of different heights on a center axis of the inner tank 4B, which are a transfer position (I) for transferring the wafer W, a spin-dry position (II) for performing spin-dry for removing excess plating solution and water from the wafer W to which plating is applied, and the plating position (III) for applying plating onto a surface to be plated of the wafer W. The wafer W held in the holder container 41 located at the transfer position (I) exists above a liquid level of the plating solution filled in the inner tank 4B. The wafer W held in the holder container 41 located at the spin-dry position (II) and the plating position (III) exists below the liquid level of the plating solution.

The holder 31 includes the substantially cylindrical holder container 41 with a top and bottom surface being closed. A piece of wafer W is substantially horizontally housed in an inner space of the holder container 41.

An opening 42 for transferring the wafer W into or out of the holder 41 is formed in a side wall of the holder container 41. An openable and closable shutter 43 is placed at the side wall near the opening 42. After the wafer W is housed inside the holder container 41, the shutter 43 is closed, whereby the opening 42 is covered to restrain the plating solution from entering the inner space of the holder container 41.

A substantially circular opening 44 for allowing a surface to be plated of the wafer W to contact the plating solution is formed in a bottom surface of the holder container 41. Here, the wafer W according to the present embodiment is held by the holder container 41 with a so-called face down method in which the plated surface faces downward.

A so-called seed layer that is a thin film of the same substance as plating is formed on the surface to be plated of the wafer W by a film forming apparatus placed inside another system, for example, by a PVD apparatus. As a result that the seed layer is formed, voltage applied to a cathode electrode 46 that will be described later is also applied to the surface to be plated of the wafer W. Further, a connecting hole or a wiring groove is formed on the surface to be plated of the wafer W.

A ring seal member 45 is placed inside a bottom surface of the holder container 41. The wafer W is pressed to the seal member 45 with a pressing member 64 that will be described later, whereby the seal member 45 is elastically deformed and the entry of the plating solution into the inner space of the holder container 41 is restrained. When the wafer W is pressed by the seal member 45, the inside of the holder container 41 is brought into an airtight state.

The cathode electrode 46 (the first electrode) for supplying electricity to the surface to be plated of the wafer W is placed on the seal member 45. The cathode electrode 46 is electrically connected to the power supply not shown. Semicircular contacts 47, that are in contact with the outer circumferential part of the surface to be plated of the wafer W at the positions of, for example, the 128 equal parts into which the circumference is divided, is projectingly provided at the cathode electrode 46. By forming the contact 47 to be semicircular, the wafer W is in contact with each of the contacts 47 at a constant area.

A wafer raising and lowering mechanism 51 (substrate raising and lowering mechanism) for holding the wafer W and raising and lowering the wafer W with respect to the holder 31 is placed at an area from the inner space of the holder container 41 to above the motor 32.

The wafer raising and lowering mechanism 51 is composed of, for example, an extendable and contractible chuck member 52, and a vacuum pump 53 for suction-drawing an inside of the chuck member 52. The chuck member 52 is composed of a substantially disc-shaped suction part 55 in which at least one or more, for example, three suction grooves 54 are formed, and an extendable and contractible shaft part 57 in which a hole 56 is formed in a longitudinal direction. The chuck member 52 is constructed to rotate with the holder container 41 by the drive of the motor 32.

The vacuum pump 53 communicates with the suction groove 54 via the hole 56 of the chuck member 52. The vacuum pump 53 draws air or nitrogen inside the suction groove 54 by suction, whereby the wafer W is sucked by the suction part 55 and held.

The wafer W is raised and lowered between mainly three positions of different heights that are a transfer position (i) for the wafer W to be transferred, a nitrogen supplying position (ii) for supplying nitrogen that will be described later into the inner space of the holder container 41, and a holder holding position (iii) for the wafer W to be held by the holder container 41. The nitrogen supplying position (ii) is at a height at which a liquid film of the plating solution that is formed between the wafer W and the seal member 45 and will be described later is not easily broken, more specifically, at a height of 5 mm or less from the top of the seal member 45, for example. The control of raising and lowering as described above is carried out by a controller not shown.

A support mechanism 61 for supporting the chuck member 52 is attached at the shaft part 57 of the chuck member 52. The support mechanism 61 is composed of, for example, four supporting columns 62 fixed on the motor 32, and a supporting member 63 fixed at each of the supporting columns 62 and the shaft part 57 of the chuck member 52. The shaft part 57 of the chuck member 52 is rotatably fixed at the supporting member 63.

The ring-shaped pressing member 64 for pressing the wafer W is placed in the space inside the holder container 41. The pressing member 64 is constructed to be raised and lowered with respect to the holder container 41 by the drive of the pressing member raising and lowering mechanism not shown. The pressing member 64 lowers and presses the wafer W in contact with the seal member 45, whereby the seal member 45 is elastically deformed and an area between the wafer W and the seal member 45 is sealed.

A ring-shaped hole 65 and four radial holes 66 communicating with the hole 65 are formed in the pressing member 64. A nitrogen supplying mechanism 71 (pressurizing mechanism) for supplying nitrogen into the hole 65 is connected to the pressing member 64.

The nitrogen supplying mechanism 71 is composed of, for example, a nitrogen cylinder not shown placed outside the plating apparatus 1 and storing nitrogen, a pipe 72 connected to the nitrogen cylinder and the hole 65, and a valve 73 interposed in the pipe 72. By opening the valve 73, nitrogen is supplied into the hole 65 via the pipe 72, and is then supplied into the inner space of the holder container 41 from the hole 66.

Figure 4:
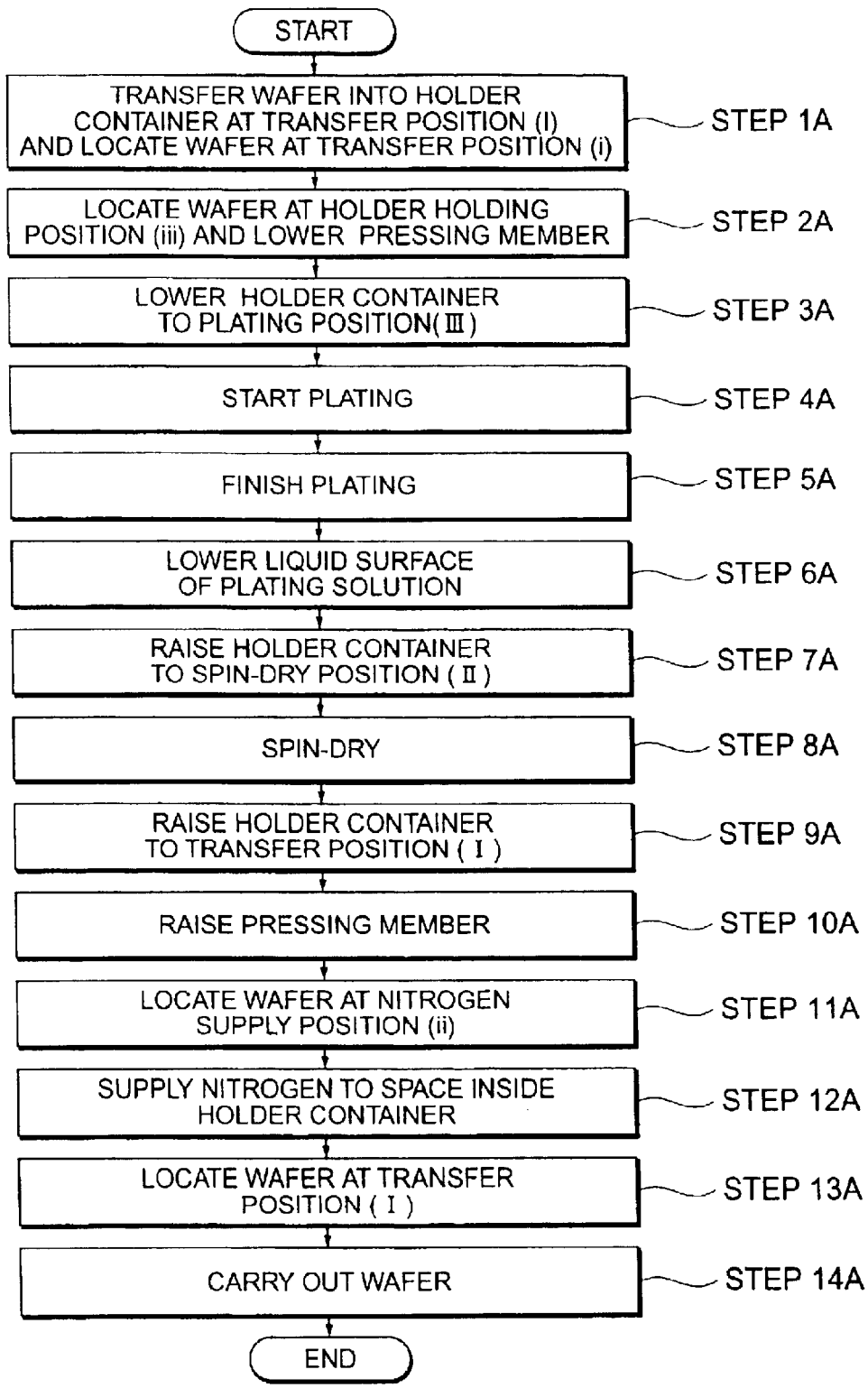
FIG. 4 is a flowchart showing a flow of processing performed in the plating apparatus according to the first embodiment.
Figure 5A:
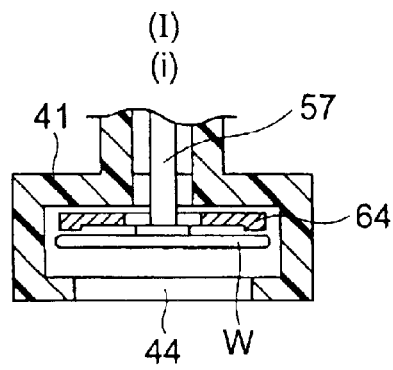
FIG. 5A to FIG. 5N are schematic views of processing steps according to the first embodiment.
Figure 5B:
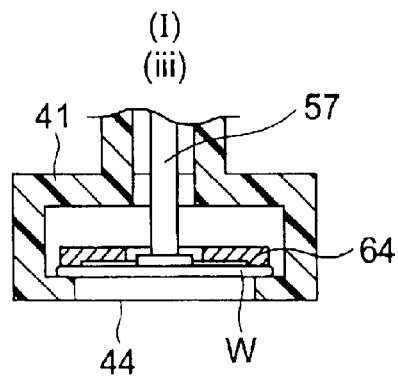
Figure 5B:
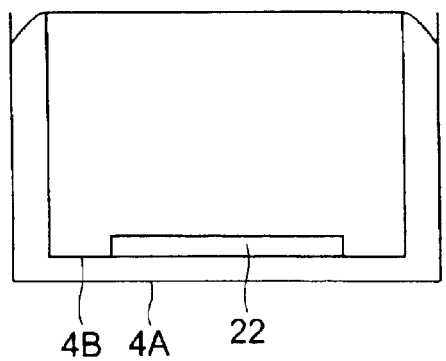
Figure 5B:
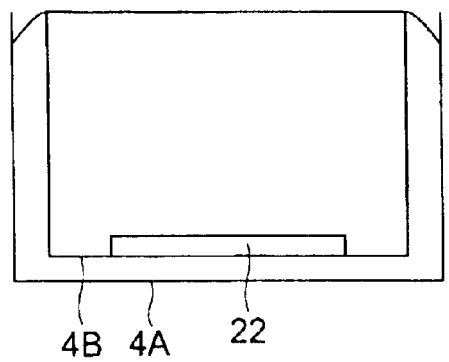

A flow of the processing carried out in the plating apparatus 1 will be explained with reference to FIG. 4 to FIG. 6B hereinafter. FIG. 4 is a flowchart showing the flow of the processing carried out in the plating apparatus 1 according to the present embodiment. FIG. 5A to FIG. 5N are schematic diagrams of the processing steps according to the present embodiment, and FIG. 6A and FIG. 6B are views showing states inside the holder container 41 when nitrogen is supplied into the inner space of the holder container 41 according to the present embodiment.

First, the gate valve 7 provided at the side wall of the housing 2 is opened, and a transfer arm not shown holding the unprocessed wafer W is extended into the holder container 41 located at the transfer position (I) via the opening 42. Thereafter, when the wafer W is located at the transfer position (i), the transfer arm stops. Subsequently, the vacuum pump 53 is operated, then the wafer W is sucked by the chuck member 52, the transfer arm stops sucking the wafer W, and the wafer W is transferred to the chuck member 52 from the transfer arm as shown in FIG. 5A. After the wafer W is transferred to the chuck member 52 from the transfer arm, the transfer arm is contractedly retreated and the shutter 43 and the gate valve 7 are closed (step 1A).

After the shutter 43 and the gate valve 7 are closed, the shaft part 57 of the shuck member 52 is extended and the wafer W is located at the holder holding position (iii). Further, as shown in FIG. 5B, the pressing member 64 is lowered by the drive of the pressing member raising and lowering mechanism not shown, and the wafer W is pressed to the seal member 45 (step 2A). By this pressing, the seal member 45 is elastically deformed, and the area between the wafer W and the seal member 45 is sealed.

Figure 5C:
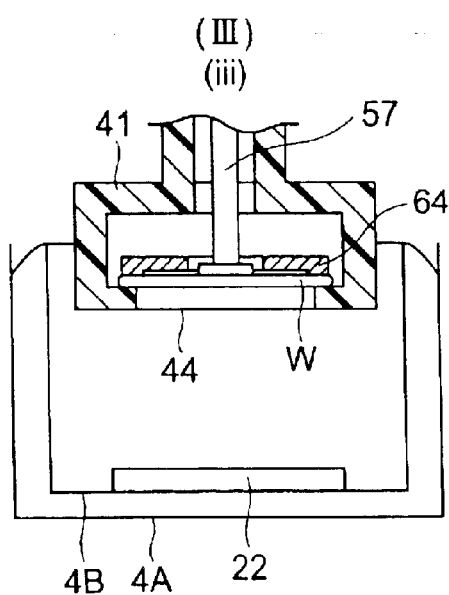
Figure 6A:
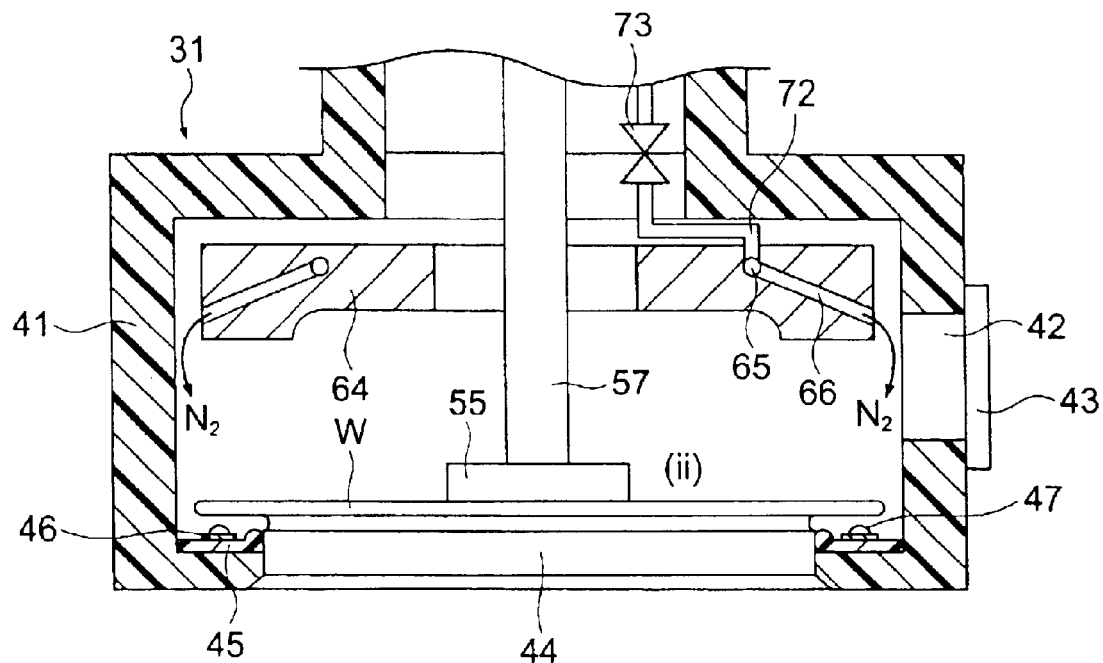
FIG. 6A and FIG. 6B are views showing states inside a holder container when nitrogen is supplied to an inner space of the holder container according to the first embodiment.
Figure 6B:
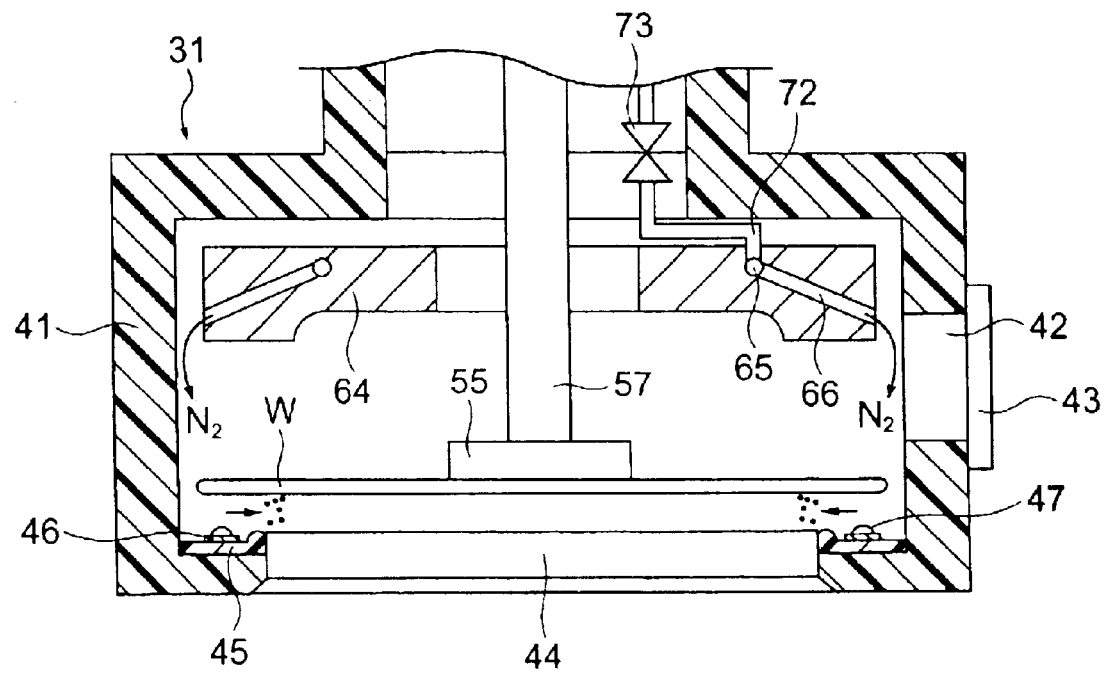

In this state, the cylinder 36 is driven and as shown in FIG. 5C, the holder container 41 is lowered to the plating position (III) (step 3A). In this situation, the inner tank 4B is filled with the plating solution.

Figure 5D:
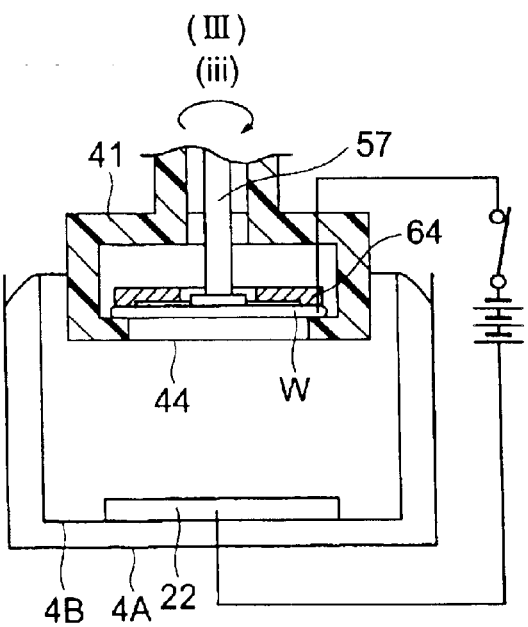

After the holder container 41 is lowered to the plating position (III), as shown in FIG. 5D, voltage is applied between the anode electrode 22 and the wafer W via the cathode electrode 46, and the plating is performed on the surface to be plated of the wafer W (step 4A). When plating is performed on the surface to be plated of the wafer W, plating is performed while the wafer W is rotated.

Figure 5E:
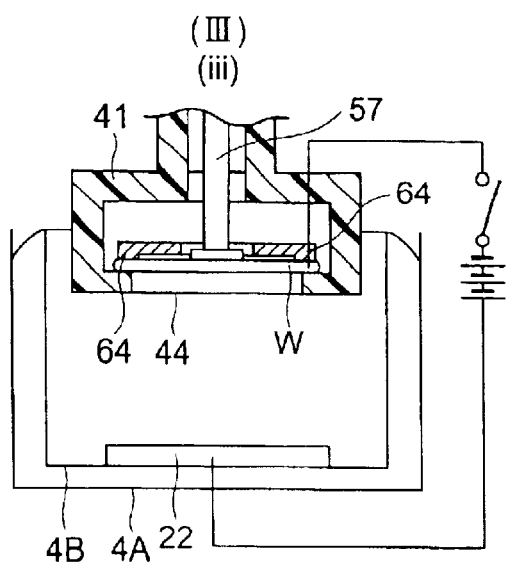

After plating of sufficient thickness is applied onto the surface to be plated of the wafer W, as shown in FIG. 5E, application of the voltage is stopped, whereby applying of the plating is finished (step 5A). On this occasion, the drive of the motor 32 is stopped and the rotation of the wafer W is stopped.

Figure 5F:
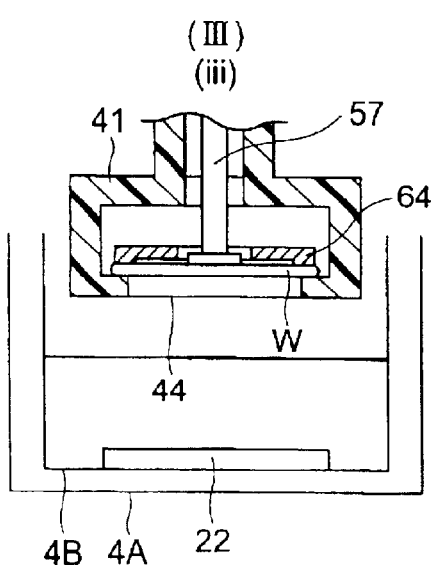

Subsequently, the valve 15 is opened, and a predetermined quantity of the plating solution is returned to the tank 13 not shown. Thereby, as shown in FIG. 5F, the liquid level of the plating solution inside the inner tank 4B is lowered (step 6A).

Figure 5G:
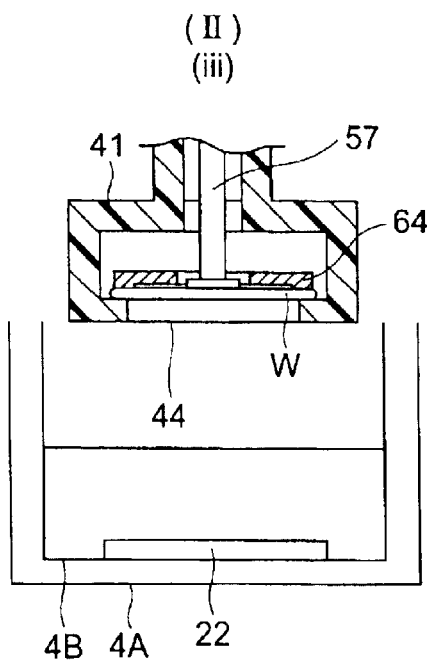

After the liquid level of the plating solution is lowered, the cylinder 36 is driven, and as shown in FIG. 5G, the holder container 41 is raised up to the spin-dry position (II) (step 7A).

Figure 5H:
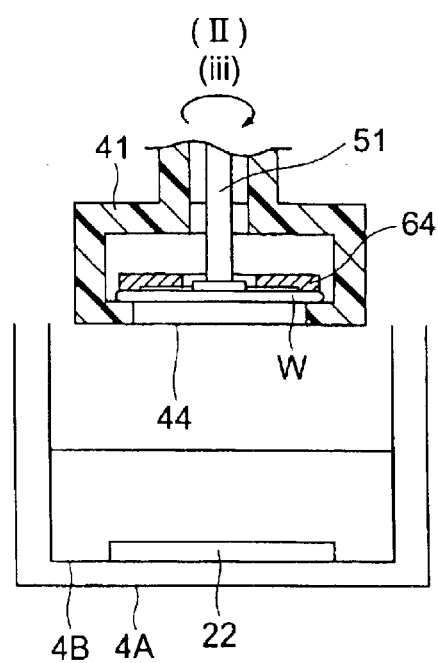

In this state, the wafer W is roared within a substantially horizontal plane by the drive of the motor 32, and as shown in FIG. 5H, spin-dry is performed (step 8A).

Figure 5I:
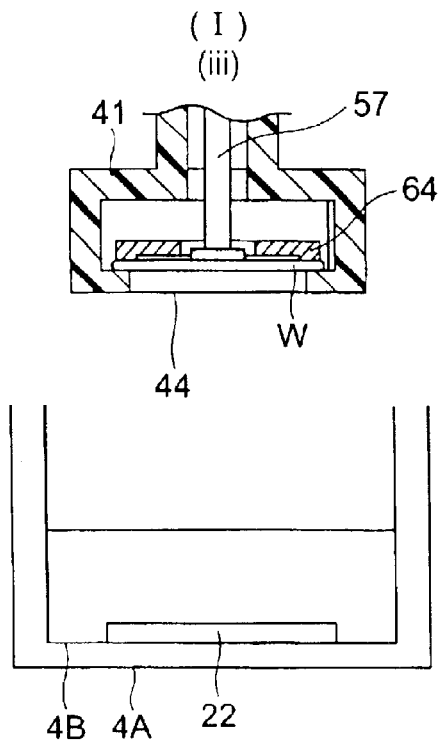

After spin-dry is sufficiently carried out, the cylinder 36 is driven, and as shown in FIG. 5I, the holder container 41 is raised up to the transfer position (I) (step 9A).

Figure 5J:
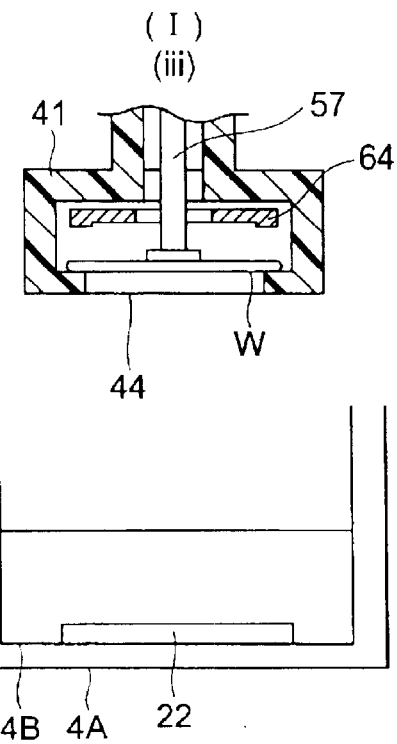

After the holder container 41 is raised up to the transfer position (I), the pressing member raising and lowering mechanism is driven and as shown in FIG. 5J, the pressing member 64 is raised (step 10A). As a result that the pressing member 64 is raised, the pressure on the wafer W is released.

Figure 5K:
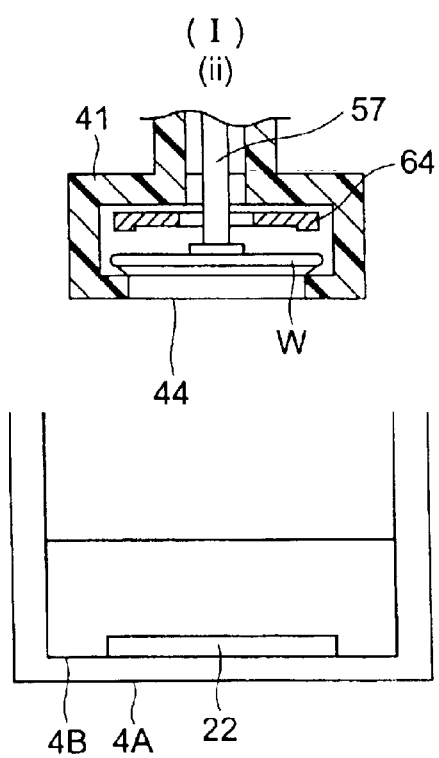

After the pressing member 64 is raised, the shaft part 57 of the chuck member 52 is contractedly retreated, and as shown in FIG. 5K, the wafer W is located at the nitrogen supplying position (ii) (step 11A). Here, at the contact portion of the seal member 45 and the wafer W, the plating solution which cannot be removed by spin-dry remains. Since the plating solution contains a surface active agent, it has high viscosity. Therefore, when the wafer W is separated from the seal member 45, a ring-shaped liquid film of the plating solution is sometimes formed between the wafer W and the seal member 45. Even when this liquid film is formed, it is difficult for this liquid film to be broken at the height of the nitrogen supplying position (ii).

Figure 5L:
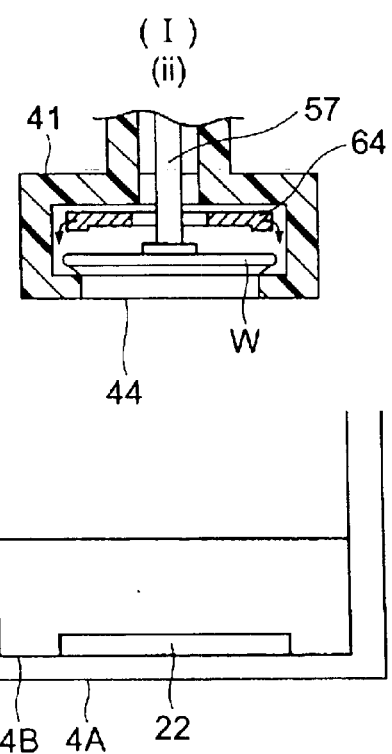

After the wafer W is located at the nitrogen supplying position (ii), the valve 73 is opened, and as shown in FIG. 5L, nitrogen is supplied from the hole 66 (step 12A). Nitrogen is supplied into the inner space of the holder container 41 from the hole 66, whereby the pressure in the inner space of the holder container 41 is raised.

After the pressure in the inner space of the holder container 41 is raised, the shaft part 57 of the chuck member 52 is contractedly retreated, and as shown in FIG. 5M, the wafer W is located at the transfer position (i) (step 13A).

In the present embodiment, in the state in which the pressure in the inner space of the holder container 41 is raised, the wafer W is raised from the nitrogen supplying position (ii) to the transfer position (i), and therefore contamination of the wafer W is reduced. Specifically, when a liquid film is formed between the wafer W and the seal member 45, the liquid film does not break and exists while the wafer W is located at the nitrogen supplying position (ii). In this state, as shown in FIG. 6A, the pressure in the inner space of the holder container 41 is raised. Thereafter, the wafer W is raised from the nitrogen supplying position (ii) to the transfer position (i), and therefore even if the liquid film breaks on its way up to the transfer position (i), the plating solution composing the liquid film scatters toward the inside of the radius of the wafer W as shown in FIG. 6B. Accordingly, the plating solution entering the inner space of the holder container 41 reduces. Meanwhile, since the wafer W is excellent in wettability, the liquid film easily moves to the outside of the radius of the wafer W, but the pressure in the inner space of the holder container 41 is raised, and thereby the liquid film is pressed to return to the inside of the radius of the wafer W. In this state, the liquid film breaks, and therefore the plating solution entering the inner space of the holder container 41 reduces. As a result, the plating solution attached to the inner wall of the holder container 41, the cathode electrode 46, and the backside of the wafer W reduces, and therefore the plating solution and dried plating solution attached to the wafer Was impurities reduce. Therefore, the contamination of the wafer W reduces.

The plating solution attached to the cathode electrode 46 reduces, and thus the corrosion of the cathode electrode 46 reduces. Further, the plating solution attached to the contact 47 reduces, and therefore the dissolution of the seed layer formed on the wafer W reduces. Therefore, since the contact 47 and the wafer W are in contact with each other in a dry state, an electric current feeds into the wafer W uniformly, and the uniformity of the plating applied to the wafer W is improved.

After the wafer W is located at the transfer position (i), the shutter 43 and the gate valve 7 are opened and the transfer arm not shown extends to the inner space of the holder container 41. Next, the operation of the vacuum pump 53 is stopped, then the chuck member 52 stops sucking the wafer W and the transfer arm holds the wafer W, whereby the wafer W is transferred to the transfer arm from the chuck member 52. Thereafter, the transfer arm is retreated, and as shown in FIG. 5N, the wafer W is transferred from the housing 2 (step 14A).

(Second Embodiment)

Figure 7:
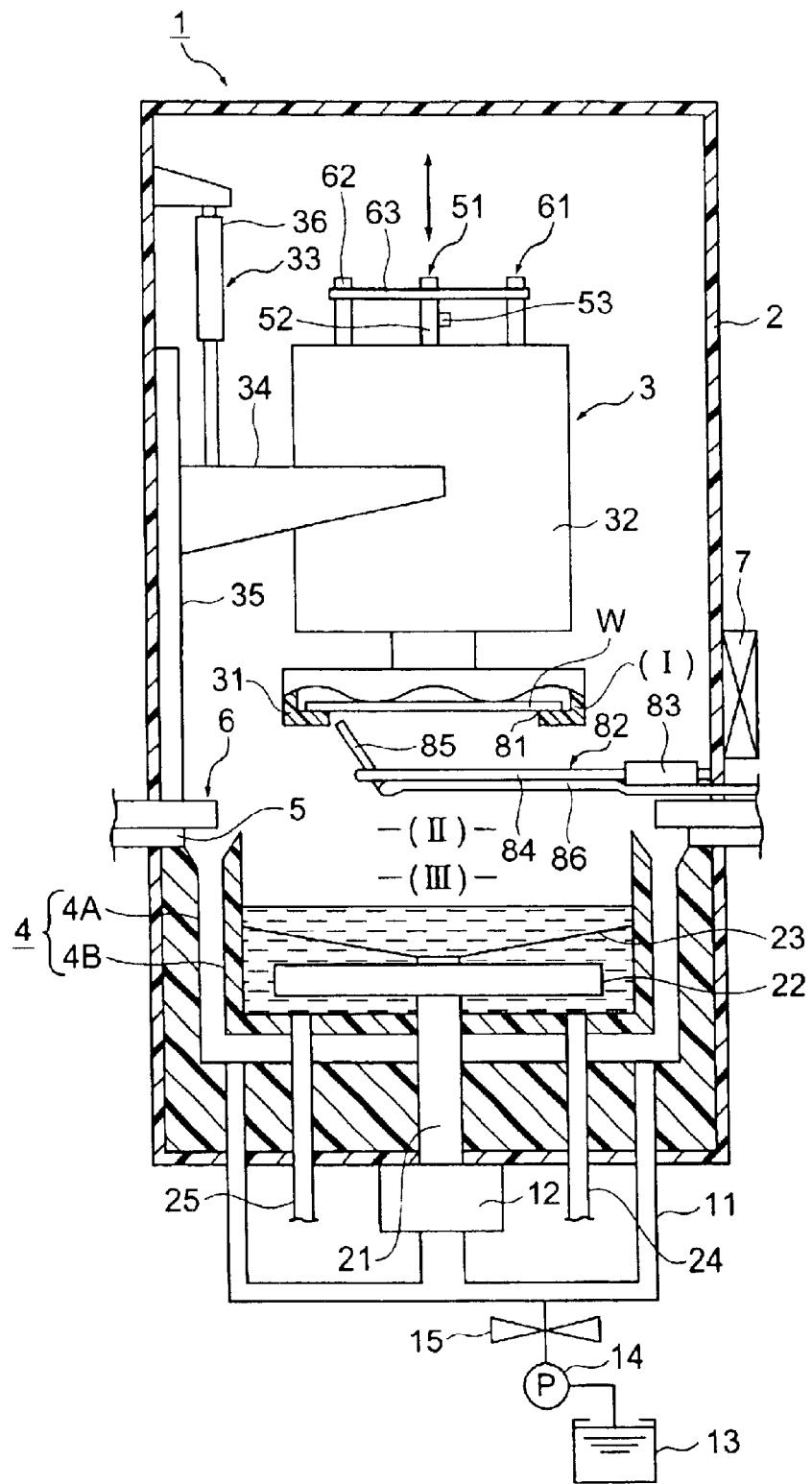
FIG. 7 is a schematic vertical sectional view of a plating apparatus according to a second embodiment.

The second embodiment of the present invention will be explained hereinafter. In the embodiments from the second embodiment, the explanation of the content overlapping the precedent embodiment is omitted in some cases. In the second embodiment, an example in which nitrogen is sprayed to the contact portion of the wafer and seal member from outside the holder container will be explained. FIG. 7 is a schematic vertical sectional view of a plating apparatus according to the present embodiment.

As shown in FIG. 7, the plating apparatus 1 of the present embodiment includes a nitrogen spraying mechanism 82 (gas spraying mechanism) for spraying nitrogen to a contact portion 81 of the wafer W and the seal member 45.

The nitrogen spraying mechanism 82 has a cylinder 83, and includes an extendable and contractible arm 84 one end of which is fixed at a side wall of the housing 2. The arm 84 holds a nitrogen spraying nozzle 85 for spraying nitrogen. A pipe 86 for supplying nitrogen inside a nitrogen cylinder not shown to the nitrogen spraying nozzle 85 is connected to the nitrogen spraying nozzle 85. The holes 65 and 66 are not formed in the pressing member 64 of the present embodiment. The nitrogen supplying mechanism 71 is not provided.

Figure 8:
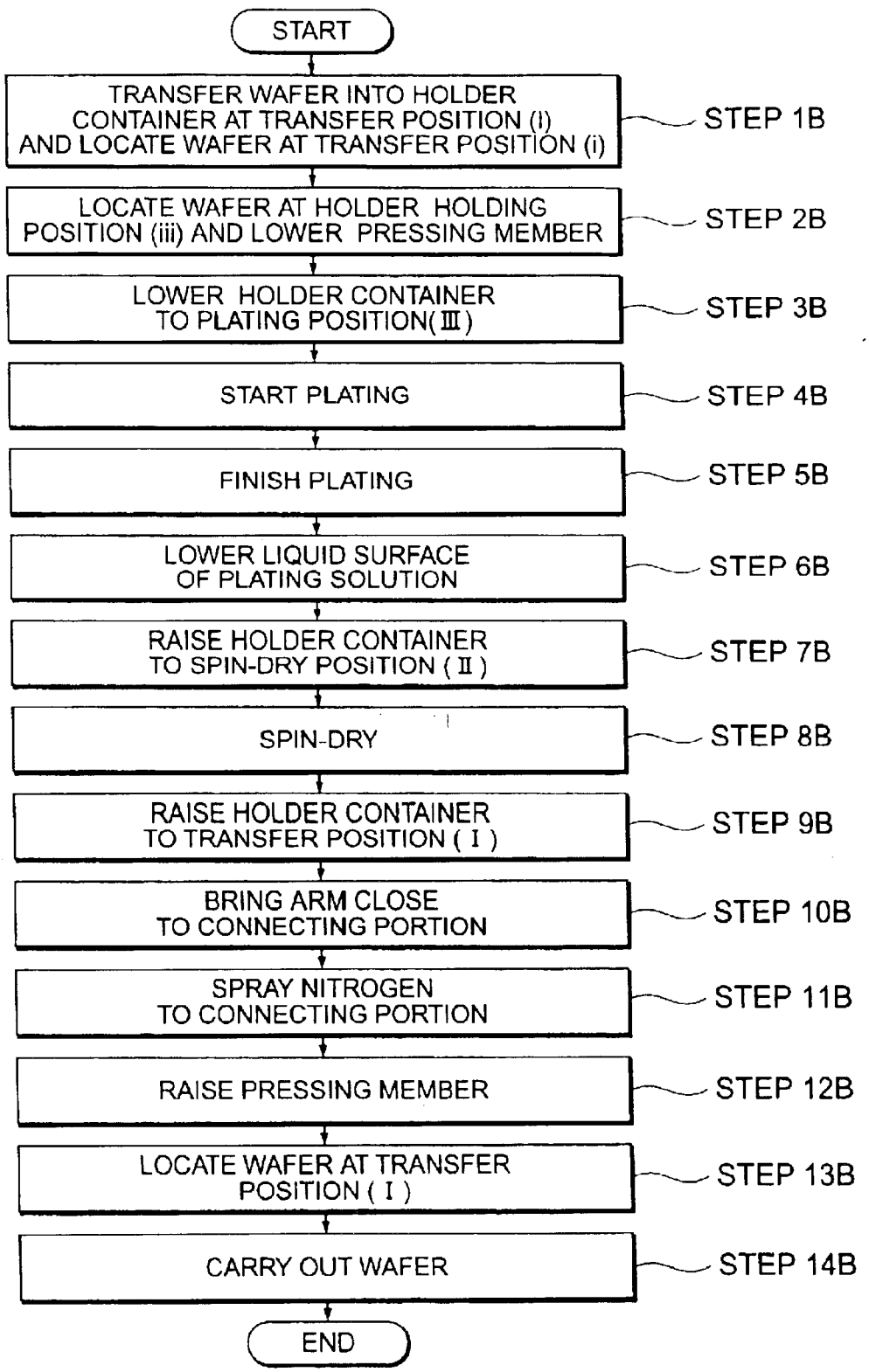
FIG. 8 is a flowchart showing a flow of processing performed in the plating apparatus according to the second embodiment.
Figure 9A:
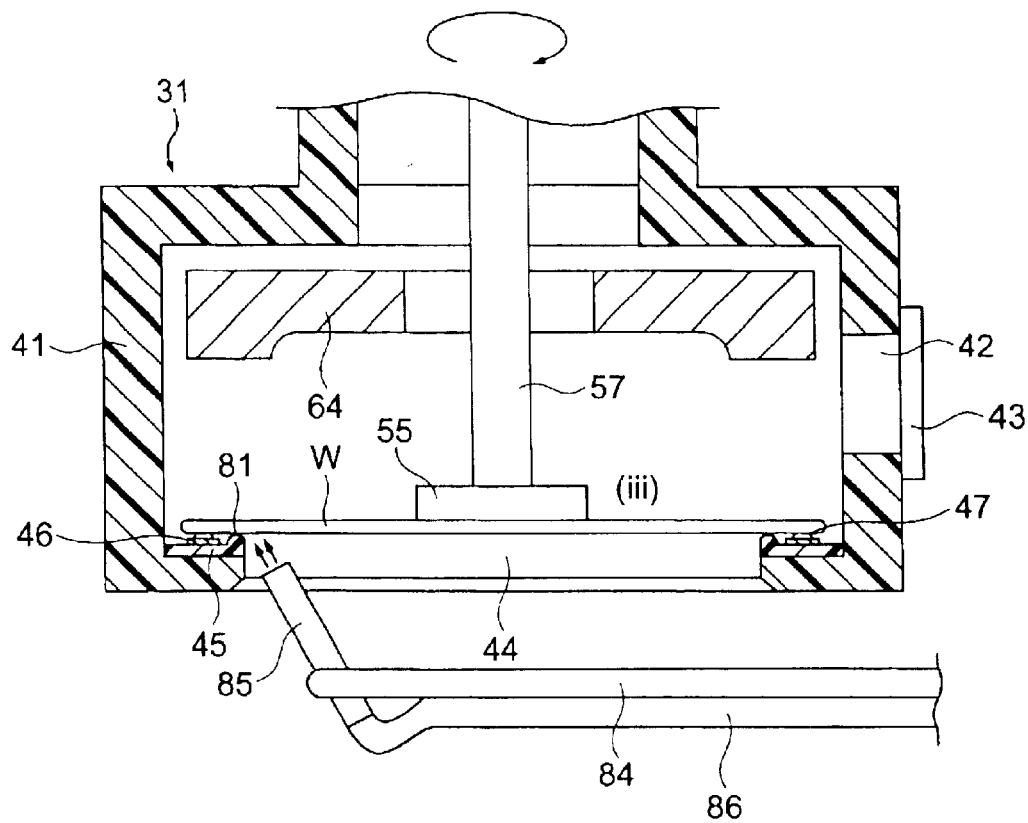
FIG. 9A and FIG. 9B are views showing states inside the holder container when nitrogen is sprayed to a contact portion according to the second embodiment.
Figure 9B:
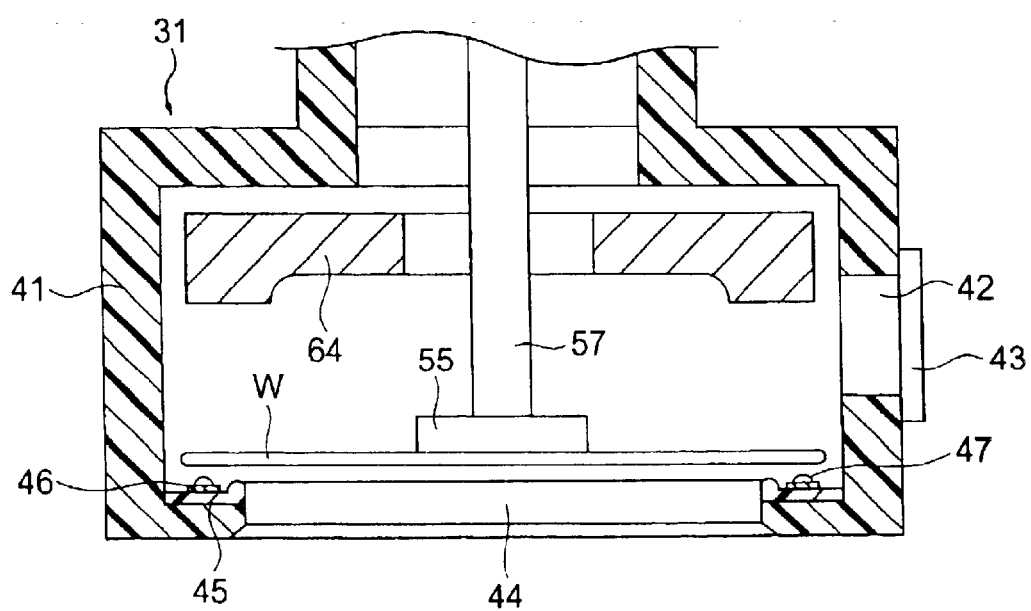

The flow of the processing performed in the plating apparatus 1 will be explained along FIG. 8 to FIG. 9B hereinafter. FIG. 8 is a flowchart showing the flow of the processing performed in the plating apparatus 1 according to the present embodiment, and FIG. 9A and FIG. 9B are views of the state inside the holder container 41 when nitrogen is sprayed to the contact portion 81 according to the present embodiment.

First, the gate valve 7 provided at the side wall of the housing 2 is opened, the wafer W is transferred into the holder container 41 located at the transfer position (I), and the wafer W is located at the transfer position (i)(step 1B).

After the wafer W is located at the transfer position (i), the shaft part 57 of the chuck member 52 extends, and the wafer W is located at the holder holding position (iii). The pressing member 64 lowers (step 2B). In this state, the cylinder 36 drives and the holder container 41 is lowered to the plating position (III) (step 3B).

After the holder container 41 is lowered to the plating position (III), voltage is applied between the anode electrode 22 and the cathode electrode 46, and plating is applied onto the surface to be plated of the wafer W (step 4B). After the plating of sufficient thickness is applied onto the surface to be plated of the wafer W, the application of the voltage is stopped, and applying of the plating is finished (step 5B).

Subsequently, the valve 15 is opened, and the liquid level of the plating solution inside the inner tank 4B is lowered (step 6B). After the liquid level of the plating solution is lowered, the cylinder 36 is driven and the holder container 41 is raised to the spin-dry position (II) (step 7B).

In this state, by the drive of the motor 32, the wafer W is rotated within a substantially horizontal plane, and spin-dry is performed (step 8B). After spin-dry is sufficiently performed, the cylinder 36 is driven, and the holder container 41 is raised to the transfer position (I) (step 9B).

After the holder container 41 is raised to the transfer position (I), the arm 84 extends, and the nitrogen spraying nozzle 85 approaches the contact portion 81 of the wafer W and the seal member 45 (step 10B).

In this state, by the drive of the motor 32, the wafer W is rotated within the substantially horizontal plane, and nitrogen is sprayed toward the contact portion 81 of the wafer W and the seal member 45 from the nitrogen spraying nozzle 85 (step 11B). After nitrogen is sufficiently sprayed to the contact portion 81 of the wafer W and the seal member 45, the pressing member raising and lowering mechanism is driven and the pressing member 64 is raised (step 12B).

After the pressing member 64 is raised, the shaft part 57 of the chuck member 52 is contractedly retreated and the wafer W is located at the transfer position (i) (step 13B).

In the present embodiment, after nitrogen is sprayed to the contact portion 81 of the wafer W and the seal member 45, the wafer W is raised to the transfer position (i) from the holder holding position (iii), and therefore contamination of the wafer W is reduced. Specifically, as shown in FIG. 9A, as a result that nitrogen is sprayed to the contact portion 81 of the wafer W and the seal member 45 from outside the holder container 41, plating solution existing near the contact portion 81 of the wafer W and the seal member 45 is blown off, and the plating solution existing near the contact portion 81 reduces. Consequently, even when the wafer W is separated from the seal member 45, it becomes difficult for a liquid film of the plating solution to be formed between the wafer W and the seal member 45 as shown in FIG. 9B. Therefore, the plating solution entering the inner space of the holder container 41 reduces, and the contamination of the wafer W reduces.

Similarly to the first embodiment, corrosion of the cathode electrode 46 reduces and uniformity of the plating applied to the wafer W is improved.

After the wafer W is located at the transfer position (i), the shutter 43 and the gate valve 7 are opened and the transfer arm not shown extends to the inner space of the holder container 41. Thereafter, the wafer W is transferred to the transfer arm from the chuck member 52, and the wafer W is transferred out of the housing 2 (step 14B).

(Third Embodiment)

Figure 10:
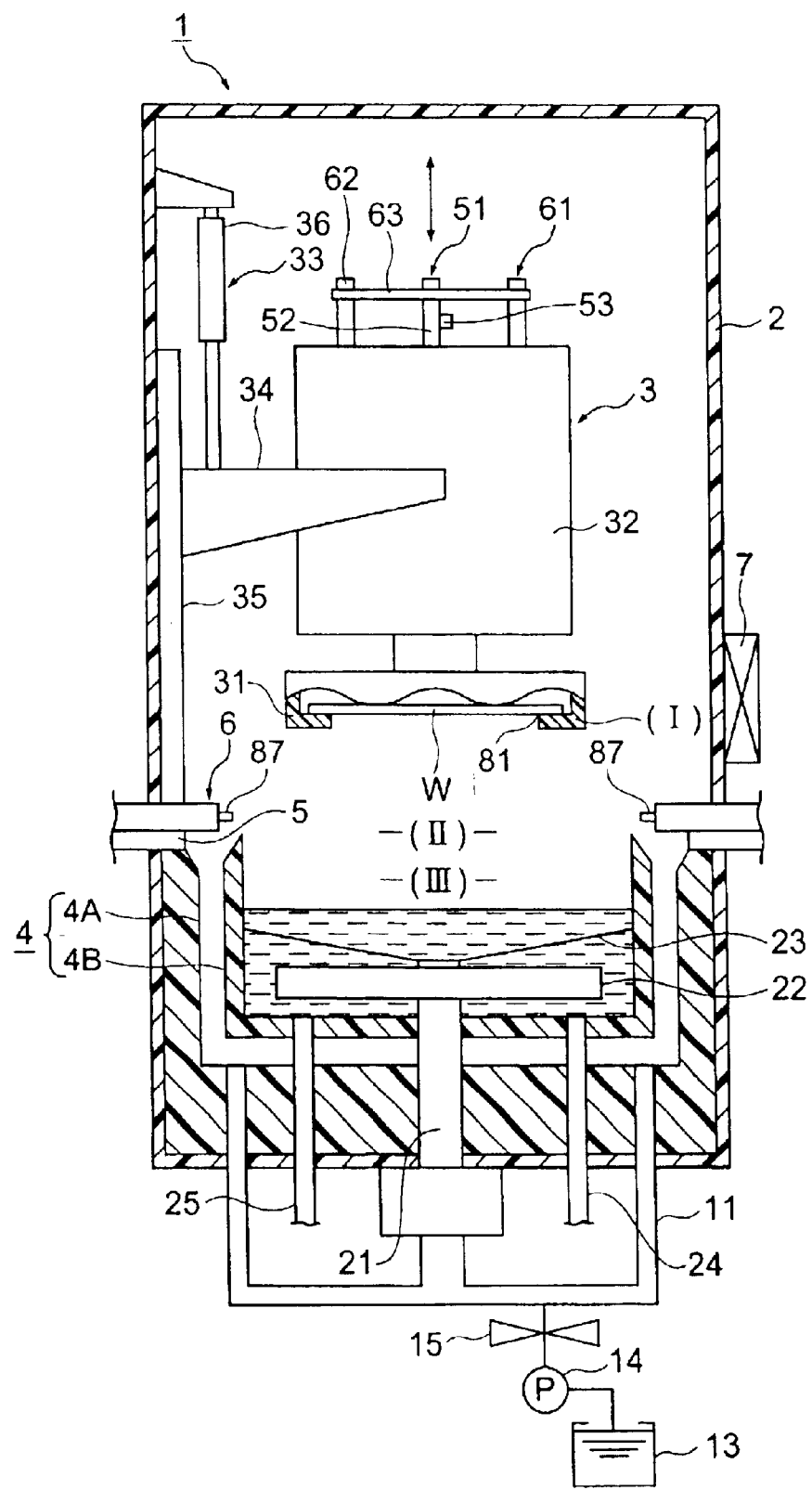
FIG. 10 is a schematic vertical sectional view of a plating apparatus according to a third embodiment.

A third embodiment of the present invention will be explained hereinafter. In the present embodiment, an example in which pure water is sprayed to the contact portion of the wafer and the seal member from outside the holder container will be explained. FIG. 10 is a schematic vertical sectional view of the plating apparatus according to this embodiment.

As shown in FIG. 10, the separator 6 of this embodiment is provided with a pure water spraying nozzle 87 (liquid spraying mechanism) which sprays pure water to the contact portion 81 of the wafer W and the seal member 45 from outside the holder container 41. Here, viscosity of pure water is lower than viscosity of the plating solution. A pure water tank storing pure water, not shown, is connected to the pure water spraying nozzle 87 via a pipe not shown.

Figure 11:
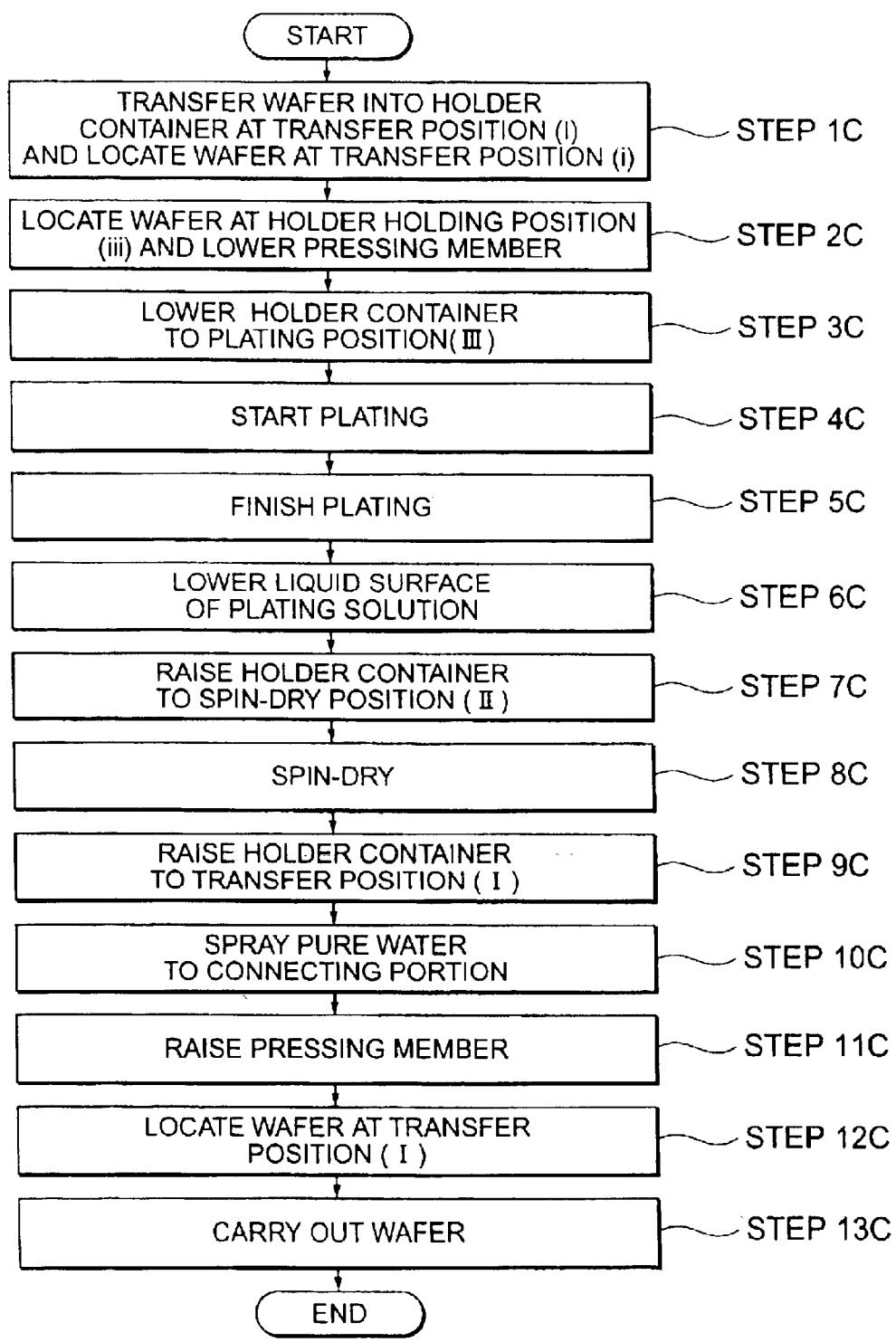
FIG. 11 is a flowchart showing a flow of processing performed in the plating apparatus according to the third embodiment.
Figure 12A:
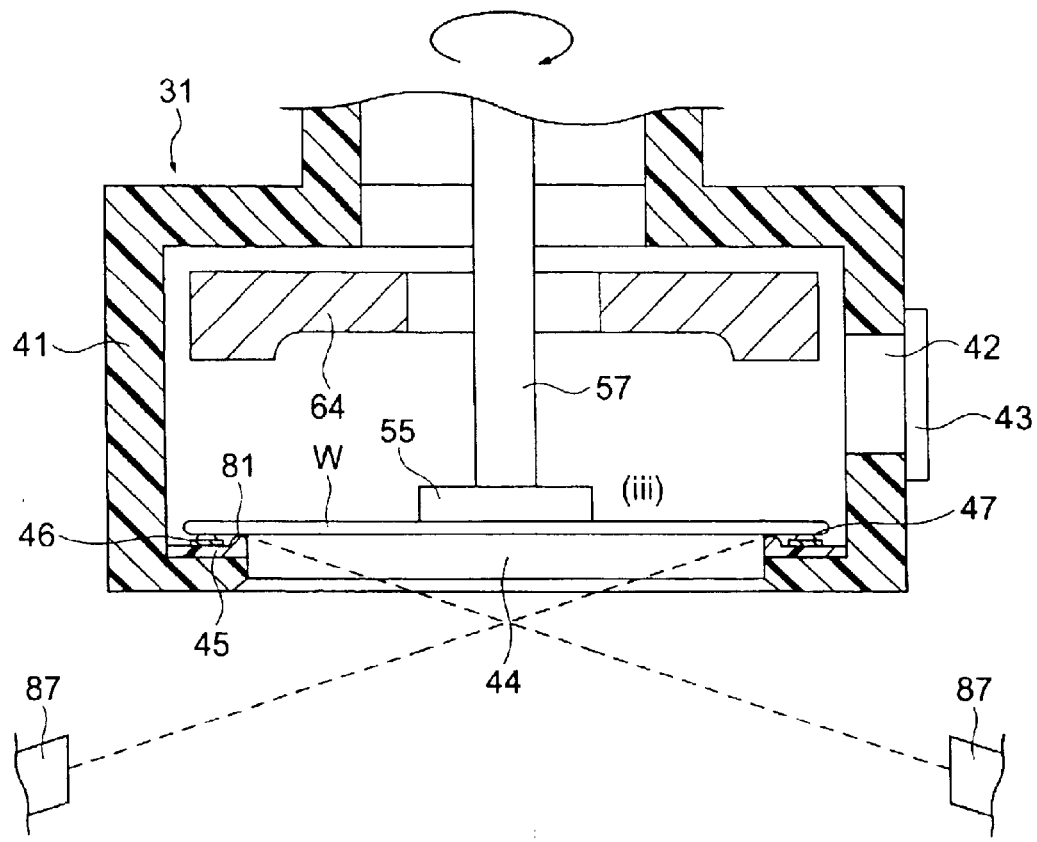
FIG. 12A and FIG. 12B are views showing states inside a holder container when pure water is sprayed to a contact portion according to the third embodiment.
Figure 12B:
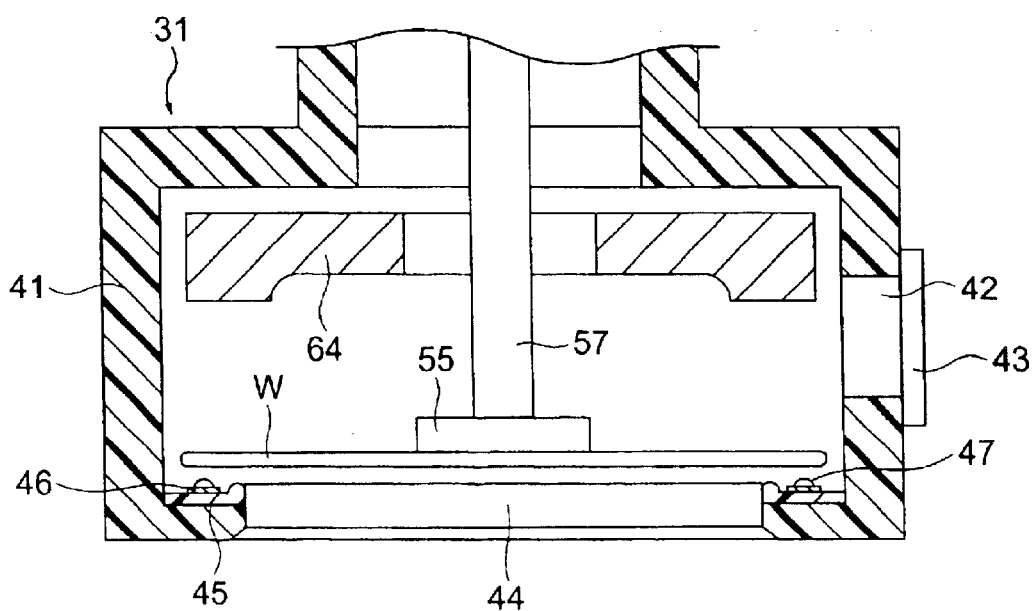

A flow of the processing performed in the plating apparatus 1 will be explained with reference to FIG. 11 to FIG. 12B. FIG. 11 is a flowchart showing the flow of the processing performed in the plating apparatus 1 according to this embodiment, and FIG. 12A and FIG. 12B are views showing a state inside the holder container 41 when pure water is sprayed to the contact portion 81 according to this embodiment.

First, the gate valve 7 provided at the side wall of the housing 2 is opened, then the wafer W is transferred into the holder container 41 located at the transfer position (I), and the wafer W is located at the transfer position (i)(step 1C).

After the wafer W is located at the transfer position (i), the shaft part 57 of the chuck member 52 extends, and the wafer W is located at the holder holding position (iii). The pressing member 64 is lowered (step 2C). In this state, the cylinder 36 is driven and the holder container 41 is lowered to the plating position (III) (step 3C).

After the holder container 41 is lowered to the plating position (III), voltage is applied between the anode electrode 22 and the cathode electrode 46, and plating is applied to the surface to be plated of the wafer W (step 4C). After the plating of sufficient thickness is applied to the surface to be plated of the wafer W, application of the voltage is stopped and applying of plating is finished (step 5C).

Subsequently, the valve 15 is opened, and the liquid level of the plating solution inside the inner tank 4B is lowered (step 6C). After the liquid level of the plating solution is lowered, the cylinder 36 is driven and the holder container 41 is raised up to the spin-dry position (II) (step 7C).

In this state, by the drive of the motor 32, the wafer W is rotated within the substantially horizontal plane, and spin-dry is performed (step 8C). After spin-dry is sufficiently performed, the cylinder 36 is driven and the holder container 41 is raised up to the transfer position (I) (step 9C).

After the holder container 41 is raised up to the transfer position (I), the wafer W is rotated within the substantially horizontal plane by drive of the motor 32, and pure water is sprayed to the contact portion 81 of the wafer W and the seal member 45 from the pure water spraying nozzle 87 (step 10C). After pure water is sufficiently sprayed to the contact portion 81 of the wafer W and the seal member 45, the pressing member raising and lowering mechanism is driven and the pressing member 64 is raised (step 11C).

After the pressing member 64 is raised, the shaft part 57 of the chuck member 52 retreats, and the wafer W is located at the transfer position (I) (step 12C).

In the present embodiment, after pure water is sprayed to the contact portion 81 of the wafer W and the seal member 45, the wafer W is raised from the holder holding position (iii) to the transfer position (i), and therefore contamination of the wafer W reduces. Specifically, as shown in FIG. 12A, pure water is sprayed to the contact portion 81 of the wafer W and the seal member 45 from outside the holder container 41, whereby the plating solution existing near the contact portion 81 of the wafer W and the seal member 45 is expelled from the area near the contact portion 81. As a result, pure water with lower viscosity than the plating solution exists near the contact portion 81. Therefore, even when the wafer W is separated from the seal member 45, it is difficult for a ring-shaped liquid film of the plating solution to be formed between the wafer W and the seal member 45 as shown in FIG. 12B. Therefore, the plating solution entering the inner space of the holder container 41 reduces and contamination of the wafer W reduces.

Even if a liquid film of the plating solution is formed between the wafer W and the seal member 45, pure water reduces viscosity of the plating solution, and therefore the liquid film breaks when the distance between the wafer W and the seal member 45 is comparatively small. Accordingly, the liquid film breaks in a state in which scattering force is small, therefore the plating solution scatters near the seal member 45 and the plating solution entering the inner space of the holder container 41 reduces. Consequently, contamination of the wafer W reduces.

Further, since viscosity of the plating solution reduces and the plating solution exists in a liquid form, the wafer W does not adhere to the seal member 45, and the wafer W is surely separated from the seal member 45. Accordingly, when the wafer W is separated from the member 45, it never happens that the wafer W adheres to the seal member 45 and the wafer W is detached from the chuck member 52, and thus the wafer W is rapidly transferred. When the seal member 45 adheres to the wafer W and the chuck member 52 is detached from the wafer W, the chuck member 52 goes to hold the wafer W again, and the wafer W is in contact with air for a long time, and as a result, there is the possibility that the plating applied to the wafer W is oxidized.

Further, as in the first embodiment, corrosion of the cathode electrode 46 reduces and uniformity of the plating applied to the wafer W is improved.

After the wafer W is located at the transfer position (i), the shutter 43 and the gate valve 7 are opened and the transfer arm not shown extends to the inner space of the holder container 41. Thereafter, the wafer W is transferred to the transfer arm from the member 52, and the wafer W is transferred from the housing 21 (step 13C).

(Fourth Embodiment)

Figure 13:
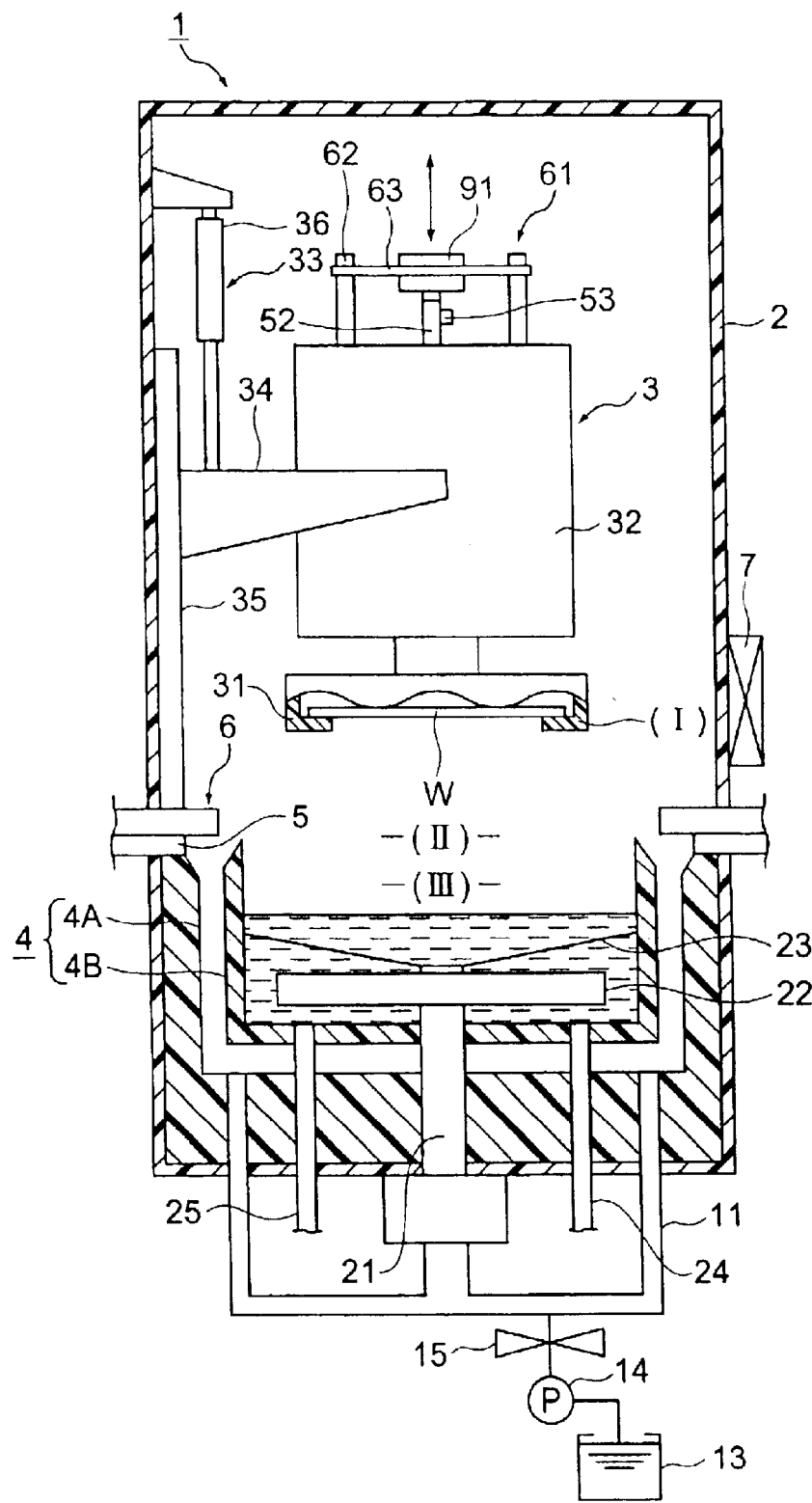
FIG. 13 is a schematic vertical sectional view of a plating apparatus according to a fourth embodiment.

A fourth embodiment of the present invention will be explained hereinafter. In this embodiment, an example in which the wafer is separated from seal member while the wafer is rotated relative to the holder will be explained. FIG. 13 is a schematic vertical sectional view of a plating apparatus according to this embodiment.

As shown in FIG. 13, a motor 91 which rotates the chuck member 52 relative to the holder container 41 is placed above the motor 32. The support member 63 is attached to the motor 91 in this embodiment.

Figure 14:
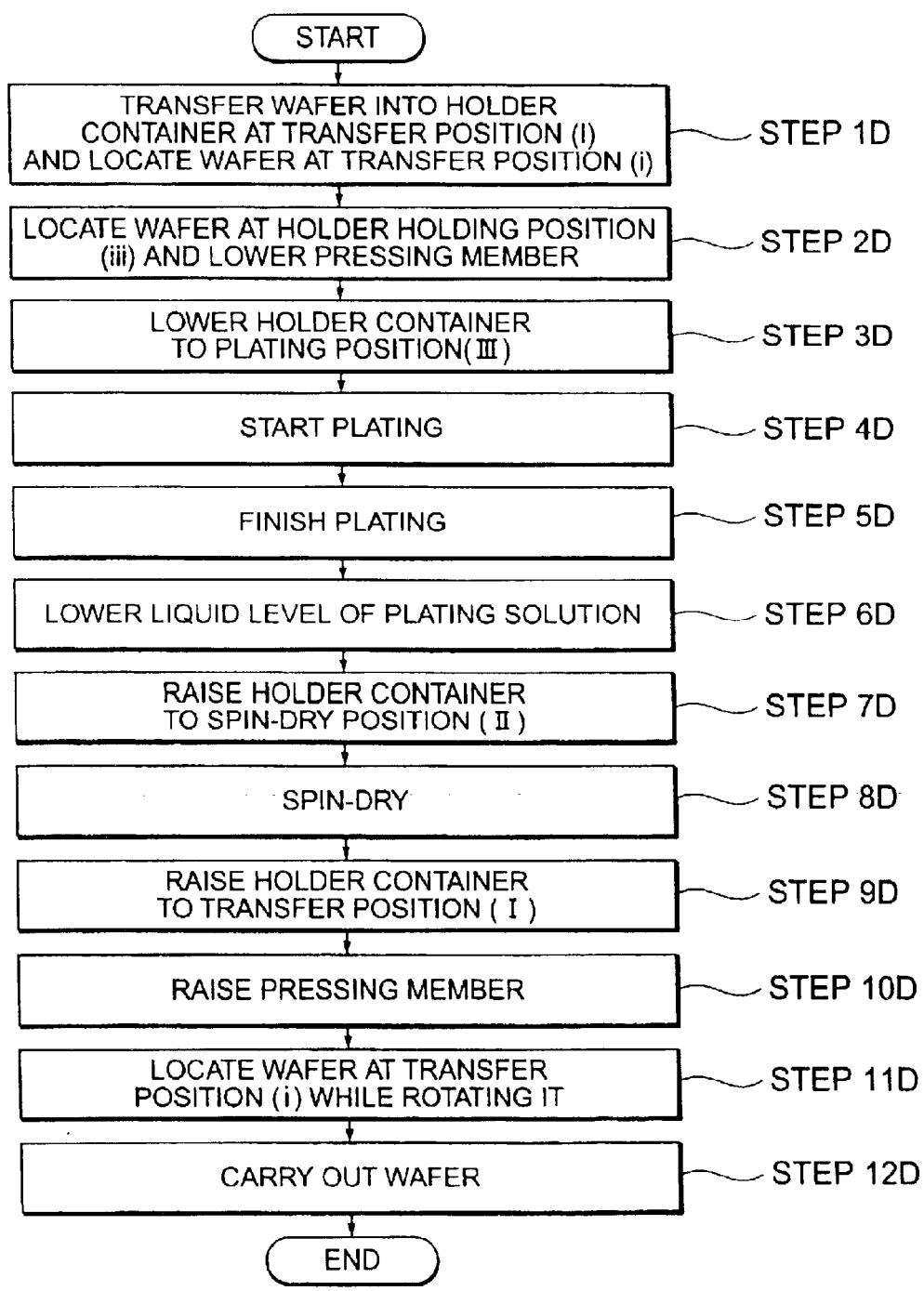
FIG. 14 is a flowchart showing a flow of processing performed in the plating apparatus according to the fourth embodiment.
Figure 15A:
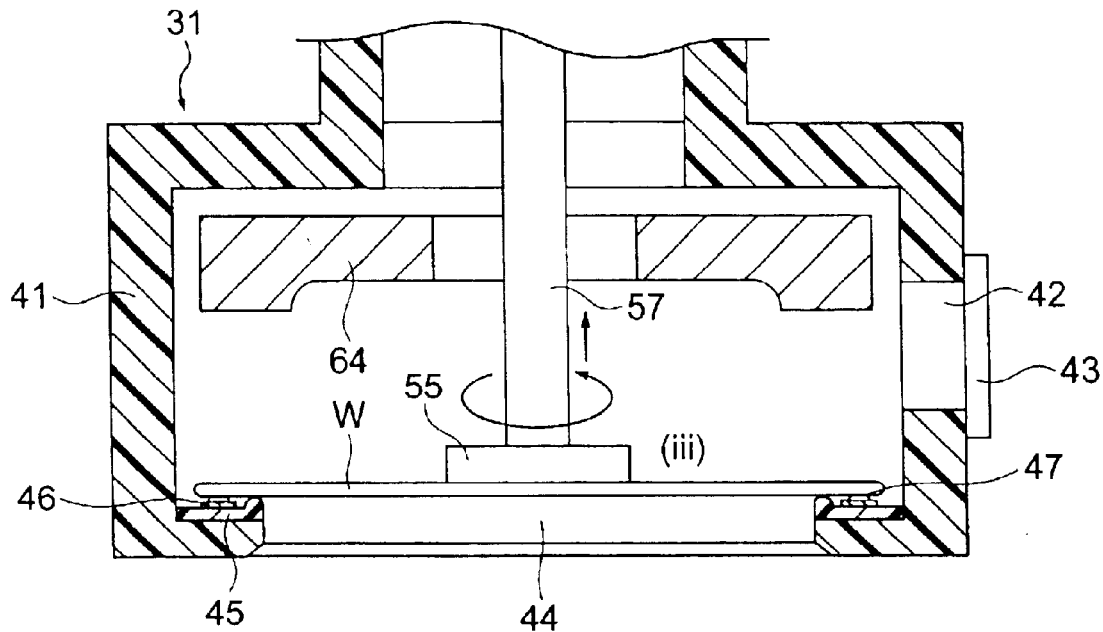
FIG. 15A and FIG. 15B are views showing states inside a holder container when a wafer is raised while being rotated according to the fourth embodiment.
Figure 15B:
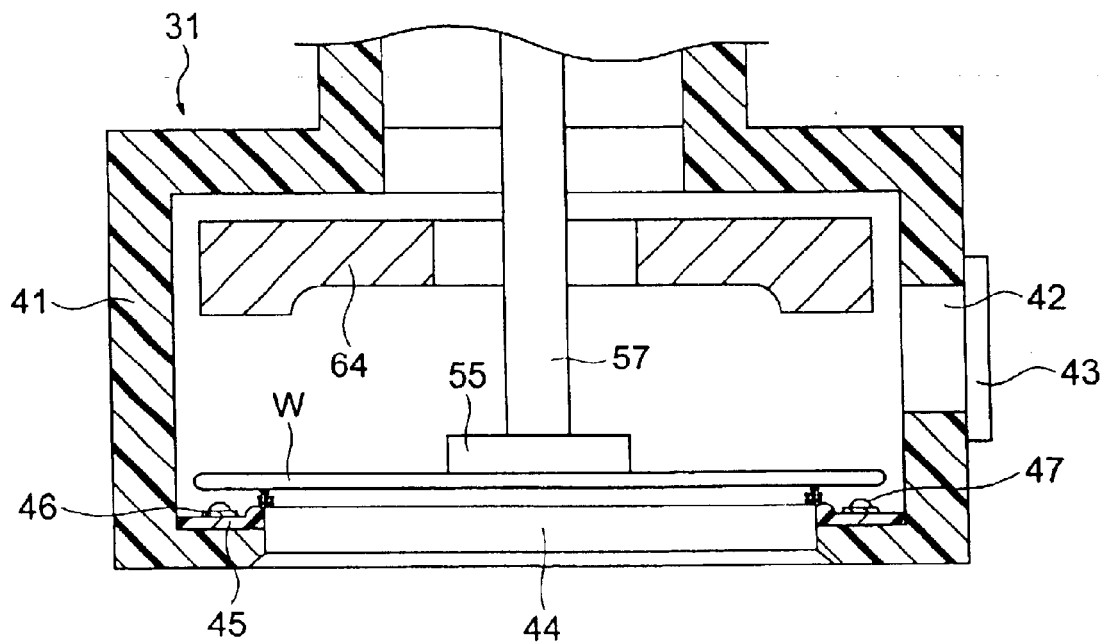

A flow of the processing performed in the plating apparatus 1 will be explained with reference to FIG. 14 to FIG. 15B hereinafter. FIG. 14 is a flowchart showing the flow of the processing performed in the plating apparatus 1 according to this embodiment, and FIG. 15A and FIG. 15B are views showing states inside the holder container 41 when the wafer W according to this embodiment is raised while it is rotated.

First, the gate valve 7 provided at the side wall of the housing 2 is opened, the wafer W is transferred into the holder container 41 located at the transfer position (I), and the wafer W is located at the transfer position (i)(step 1D).

After the wafer W is located at the transfer position (i), the shaft part 57 of the chuck member 52 extends, and the wafer W is located at the holder holding position (iii). The pressing member 64 is lowered (step 2D). In this state, the cylinder 36 is driven and the holder container 41 is lowered to the plating position (III) (step 3D).

After the holder container 41 is lowered at the plating position (III), voltage is applied between the anode electrode 22 and cathode electrode 46, and plating is applied to the surface to be plated of the wafer W (step 4D). After plating of sufficient thickness is applied to the surface to be plated of the wafer W, application of the voltage is stopped, and applying of plating is finished (step 5D).

Subsequently, the valve 15 is opened, and the liquid level of the plating solution inside the inner tank 4B is lowered (step 6D). After the liquid level of the plating solution is lowered, the cylinder 36 is driven and the holder container 41 is raised to the spin-dry position (II) (step 7D).

In this state, by the drive of the motor 32, the wafer W is rotated within a subsequently horizontal plane, and spin-dry is performed (step 8D). After the spin-dry is sufficiently performed, the cylinder 36 is driven and the holder container 41 is raised to the transfer position (I) (step 9D).

After the holder container 41 is raised to the transfer position (I), the pressing member raising and lowering mechanism is driven and the pressing member 64 is raised (step 10D). After the pressing member 64 is raised, the motor 91 is driven and the shaft part 57 of the chuck member 52 is contractedly retreated, whereby the wafer W is raised while rotating with respect to the holder container 41 and is located at the transfer position (i)(step 11D).

In the present embodiment, since the wafer W is separated from the seal member 45 while rotating with respect to the holder container 41, contamination of the wafer W is reduced. Specifically, even when a liquid film of the plating solution is formed between the wafer W and the seal member 45, the wafer W is rotated with respect to the holder container 41 as shown in FIG. 15A, the liquid film breaks when a distance between the wafer W and the seal member 45 is relatively small. Accordingly, the liquid film breaks in a state in which scattering force is small, the plating solution scatters to an area near the seal member 45 as shown in FIG. 15B, and the plating solution entering the inner space of the holder container 41 is reduced. Therefore, contamination of the wafer W is reduced.

As in the first embodiment, corrosion of the cathode electrode 46 is reduced and uniformity of the plating performed for the wafer W is improved.

After the wafer W is located at the transfer position (i), the shutter 43 and the gate valve 7 are opened and the transfer arm not shown extends to the inner space of the holder 31. Thereafter, the wafer W is transferred to the transfer arm from the chuck member 52 and the wafer W is transferred out of the housing 2 (step 12D).

(Fifth Embodiment)

Figure 16:
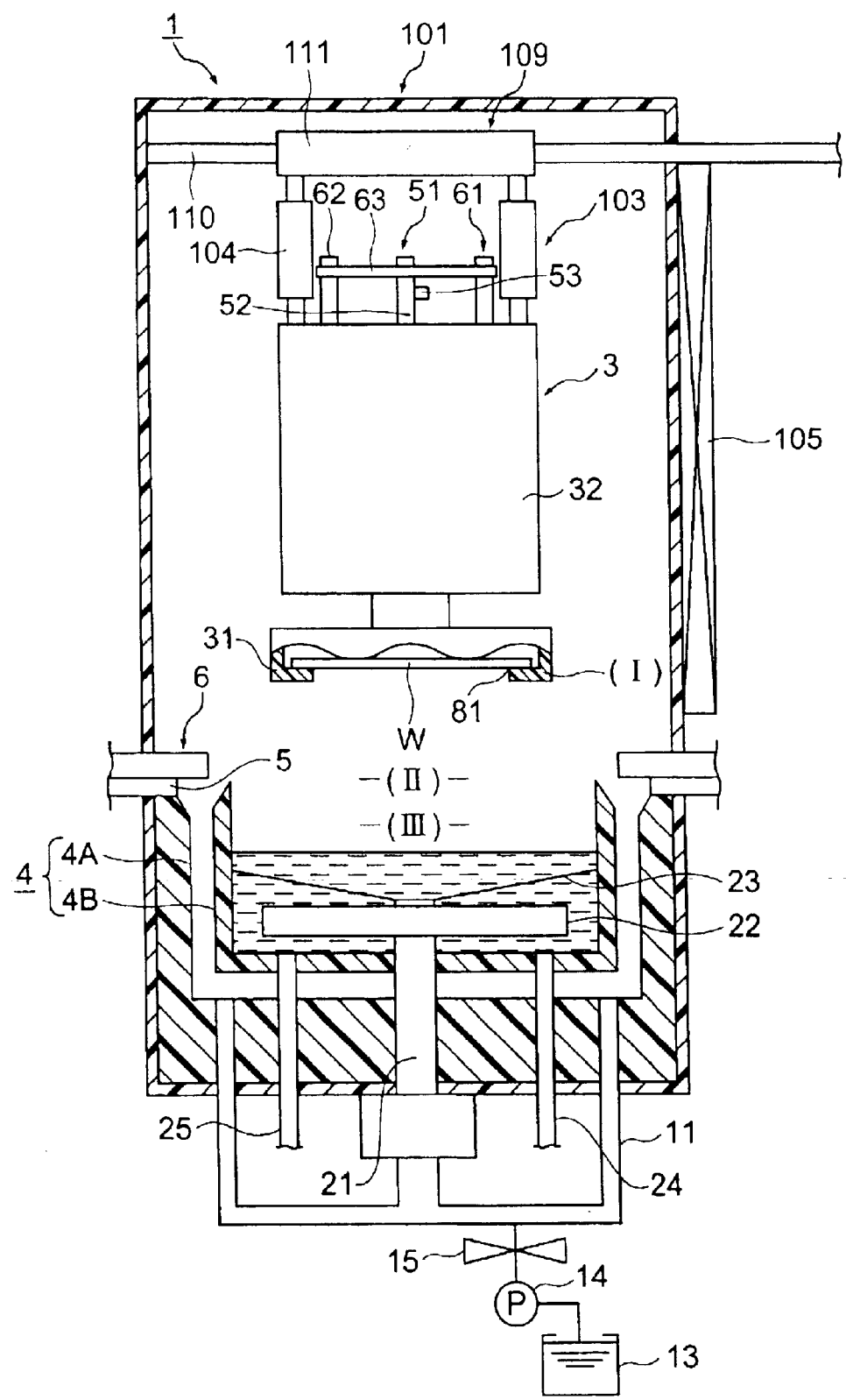
FIG. 16 is a schematic vertical sectional view of a plating unit according to a fifth embodiment.

A fifth embodiment of the present invention will be explained hereinafter. In this embodiment, an example in which the wafer is soaked in washing fluid stored in a washing fluid tank after the plating is performed for the wafer will be explained. FIG. 16 is a schematic vertical sectional view of a plating unit according to this embodiment and FIG. 17 is a schematic vertical sectional view of a washing unit according to this embodiment.

Figure 17:
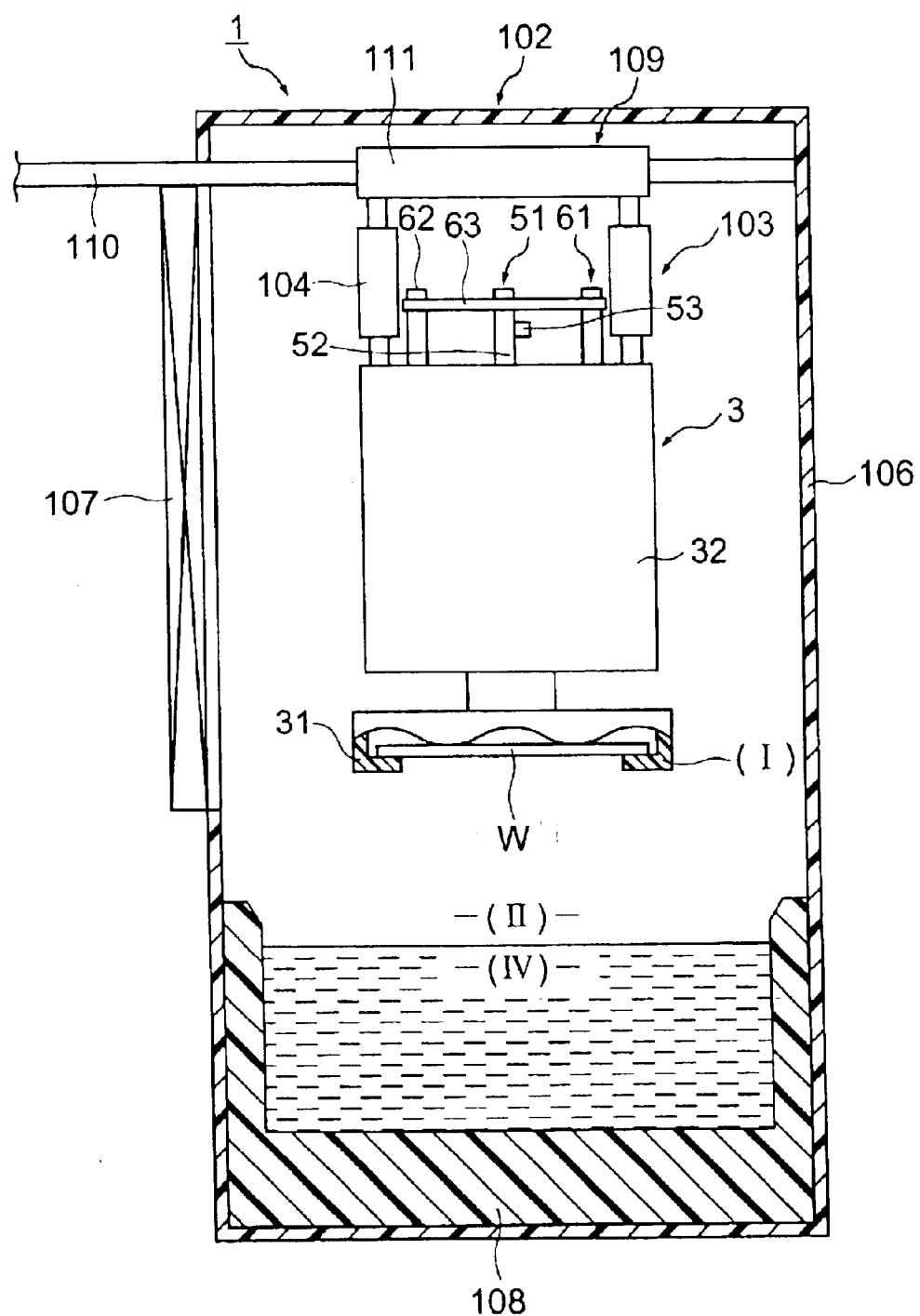
FIG. 17 is a schematic vertical sectional view of a washing unit according to the fifth embodiment.

As shown in FIG. 16 and FIG. 17, the plating apparatus 1 of this embodiment is mainly composed of a plating unit 101 which mainly performs plating for the wafer W and a washing unit 102 which washes plating performed for the wafer W.

The plating unit 101 adopts substantially the same structure of the plating apparatus 1 of the above-described first embodiment, which is constructed to make it possible to perform plating for the wafer W. In this embodiment, a holder raising and lowering mechanism 103 is composed of, for example, four cylinders 104 attached to a sliding member 111 that will be described later. A gate valve 105 of this embodiment is formed to be a size through which the driver 3 can passes.

The washing unit 102 includes a housing 106 formed of synthetic resin. The housing 106 is provided with a gate valve 107 for transferring the driver 3 into and out of the washing unit 102.

A washing fluid tank 108, which stores washing fluid, is placed inside the housing 106. Here, the holder container 41 of this embodiment also stops at a washing position (IV) for washing the wafer W.

The plating apparatus 1 includes a holder transfer mechanism 109, which transfers the holder 31 between the plating unit 101 and the washing unit 102. The holder transfer mechanism 109 in this embodiment transfers the holder 31 with the driver 3. The holder transfer mechanism 109 is mainly composed of a guide rail 110 laid across the plating unit 101 and the washing unit 102, and a slide member 111 which exists between the guide rail 110 and the driver 3 and transfers the driver 3 along the guide rail 110.

Figure 18:
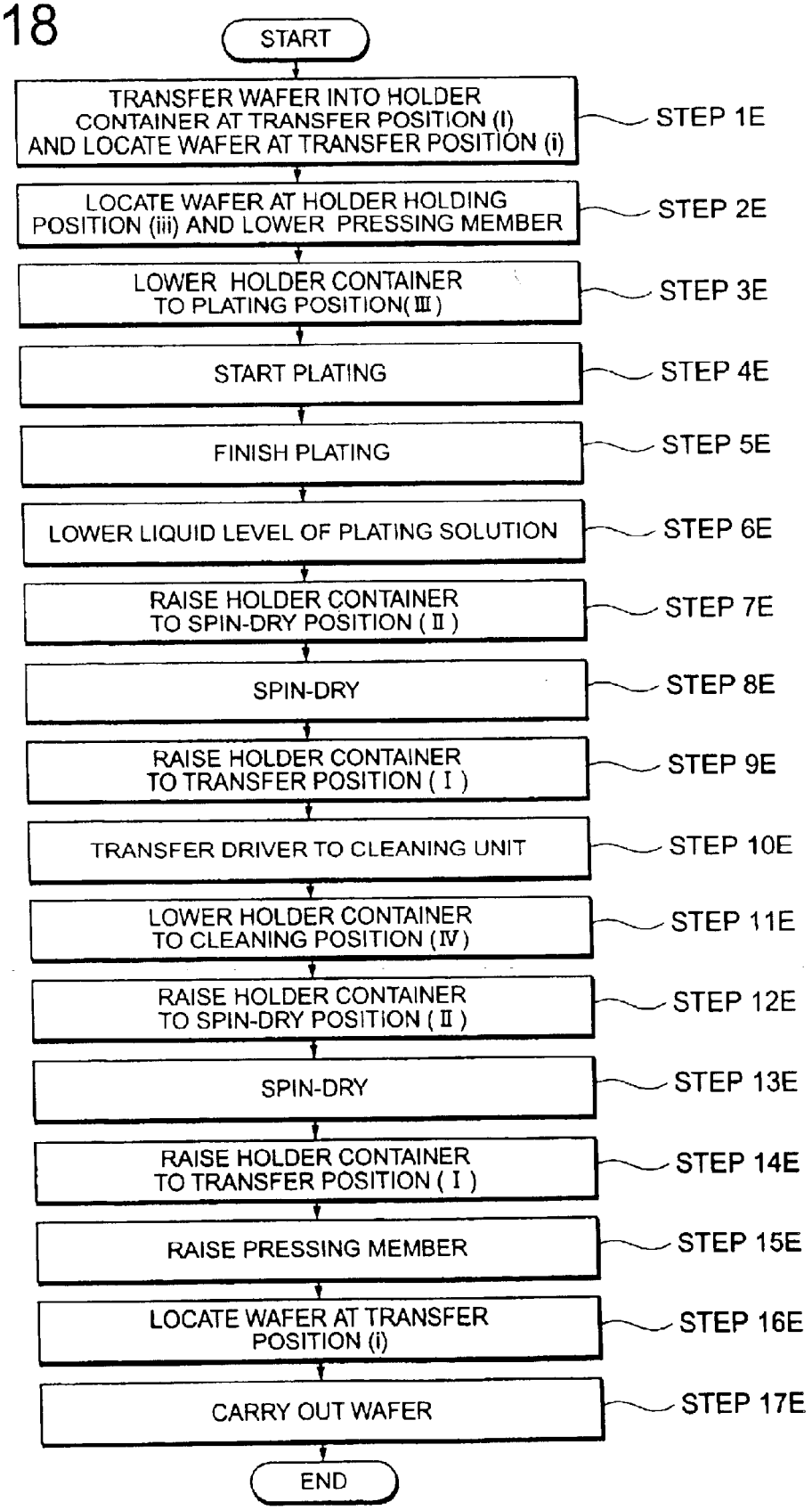
FIG. 18 is a flowchart showing a flow of processing performed in a plating apparatus according to the fifth embodiment.
Figure 19:
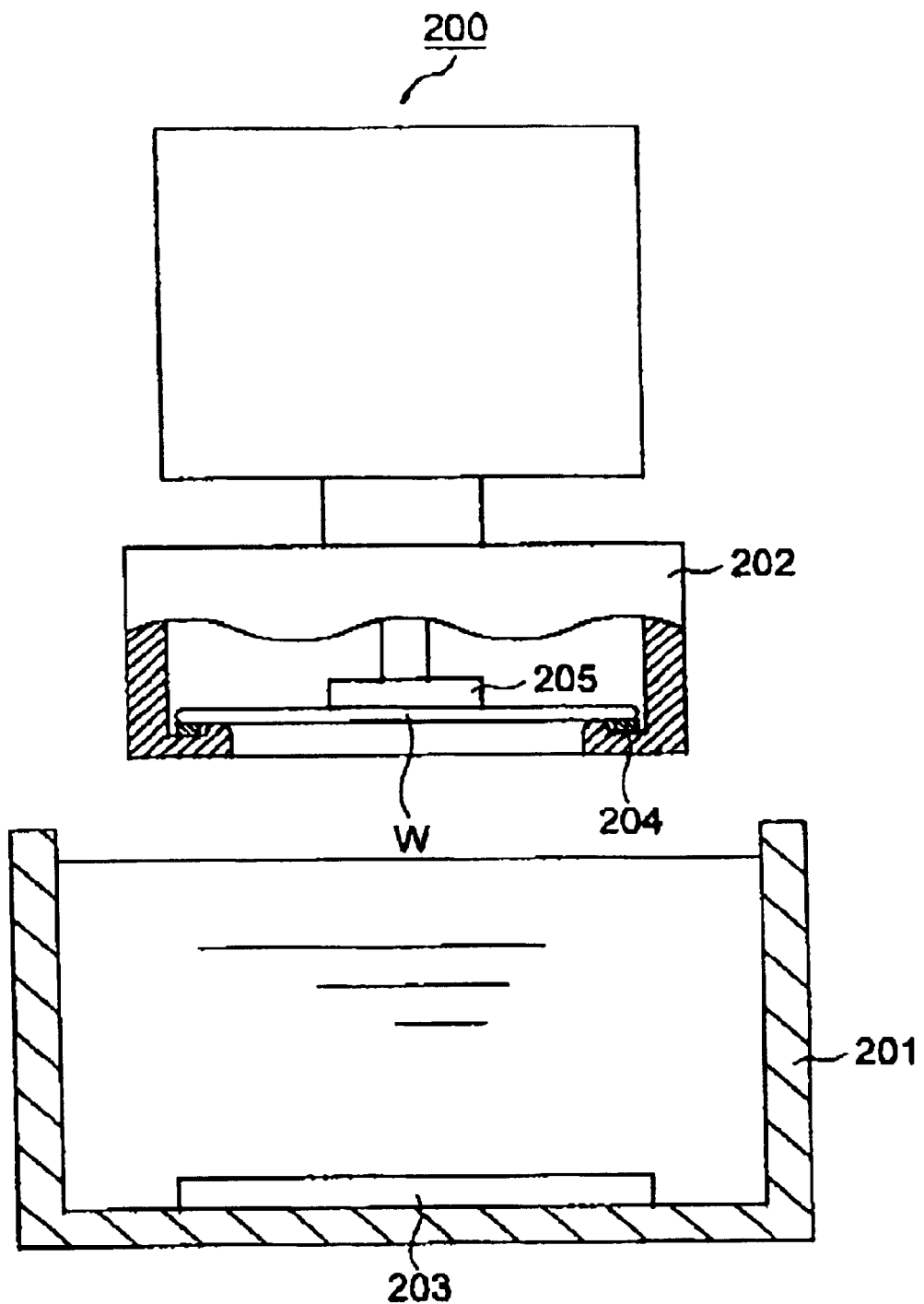
FIG. 19 is a schematic vertical sectional view of a conventional plating apparatus.

A flow of the processing performed in the plating apparatus 1 will be explained with reference to FIG. 18. FIG. 18 is a flowchart showing the flow of the processing performed in the plating apparatus 1 according to this embodiment.

First, the gate valve 105 provided at the housing 2 of the plating unit 101 is opened, then the wafer W is transferred into the holder container 41 located at the transfer position (I), and the wafer W is located at the transfer position (i) (step 1E)

After the wafer W is located at the transfer position (i), the shaft part 57 of the chuck member 52 extends, and the wafer W is located at the holder holding position (iii) (step 2E). In this state, the, cylinder 104 is driven and the holder container 41 is lowered to the plating position (III) (step 3E).

After the holder container 41 is lowered to the plating position (III), voltage is applied between the anode electrode 22 and the cathode electrode 46, and plating is applied to the surface to be plated of the wafer W (step 4E). After plating of sufficient thickness is applied to the surface to be plated of the wafer W, application of voltage is stopped, and applying of the plating is finished (step 5E).

Subsequently, the valve 15 is opened, and the liquid level of the plating solution inside the inner tank 4B is lowered (step 6E). After the liquid level of the plating solution is lowered, the cylinder 104 is driven, and the holder container 41 is raised to the spin-dry position (II) (step 7E).

In this state, by drive of the motor 32, the wafer W is rotated within the substantially horizontal plane, and spin-dry is performed (step 8E). After the spin-dry is sufficiently performed, the cylinder 104 is driven and the holder container 41 is raised to the transfer position (I) (step 9E).

After the holder container 41 is raised to the transfer position (I), the gate valves 105 and 107 are opened, and the slide member 111 is moved along the guide rail 110 and the holder container 41 is transferred to the washing unit 102 from the plating unit 101 (step 10E).

After the holder container 41 is transferred to the washing unit 102 from the plating unit 101, the cylinder 104 is driven and the holder container 41 is lowered to the washing position (IV) (step 11E). By this lowering, the wafer W is soaked in the washing fluid, and the plating applied to the wafer W is washed. When the wafer W is soaked in the washing fluid, the washing fluid also contacts the contact portion 81 of the wafer W and the seal member 45. After plating applied to the wafer W is sufficiently washed, the cylinder 104 is driven and the holder container 41 is raised to the spin-dry position (II) (step 12E).

In this state, by the drive of the motor 32, the wafer W is rotated within the substantially horizontal place, and spin-dry is performed (step 13E). After the spin-dry is sufficiently performed, the cylinder 104 is driven and the holder container 41 is raised to the transfer position (I) (step 14E).

After the holder container 41 is raised to the transfer position (I), the pressing member raising and lowering mechanism is driven and the pressing member 64 is raised (step 15E). After the pressing member 64 is raised, the shaft part 57 of the chuck member 52 is contractedly retreated and the wafer W is located at the transfer position (I) (step 16E).

In the present embodiment, the wafer W is soaked in the washing fluid stored in the washing fluid tank 108, and thus contamination of the wafer W is reduced. Specifically, when the wafer W is soaked in the washing fluid, the washing fluid also contacts the contact portion 81 of the wafer W and the seal member 45, and therefore viscosity of the plating solution existing near the contact portion 81 is reduced. As a result, a liquid film breaks when a distance between the wafer W and the seal member 45 is comparatively small. Accordingly, since the liquid film breaks in a state in which a scattering force is small, the plating solution scatters to an area near the seal member 45 and the plating solution entering the inner space of the holder container 41 is reduced. Therefore, contamination of the wafer W is reduced.

As in the first embodiment, corrosion of the cathode electrode 46 is reduced and uniformity of the plating applied to the wafer W is improved.

After the wafer W is located at the transfer position (i), the shutter 43 and the gate valve 107 are opened and the transfer arm not shown extends to the inner space of the holder container 41. Thereafter, the wafer W is transferred to the transfer arm from the chuck member 52, and the wafer W is transferred out of the housing 106 (step 17E).

The present invention is not limited to the description of the above-described embodiments, and the structure, quality, arrangement of each component and the like can be suitably changed without departing from the spirit of the present invention.

For example, in the above-described first embodiment, nitrogen is supplied in the state in which the wafer W is separated from the seal member 45, but it is also possible to supply nitrogen in the state in which the wafer W is in contact with the seal member 45. The same effect as the first embodiment can be obtained when the wafer W is separated form the holder container 41 after nitrogen is supplied to the inner space of the holder container 41. In this case, it is possible to raise the wafer W to the transfer position (i) from the holder holding position (iii) without stopping the wafer W at the nitrogen supplying position (ii).

In the above-described second embodiment, one nitrogen spraying nozzle 85 is placed, but a plurality of the nitrogen spraying nozzles 85 may be placed. In the above-described third embodiment, pure water is sprayed from the pure water spraying nozzle 87 placed at the separator 6, but pure water may be sprayed from another nozzle held by the arm as in the above-described second embodiment.

In the above-described first to fourth embodiments, after plating is applied to the wafer W, the entire plating applied to the wafer W is not washed with washing fluid like pure water, but it is possible to wash the entire plating applied to the wafer W. In this case, the plating solution existing between the wafer W and the seal member 45 is diluted with the washing fluid, thus making it more difficult for a liquid film to be formed.

In the above-described first to fifth embodiments, the wafer W is used as a substrate, but an LCD glass substrate for liquid crystal can be used. The plating solution is also used therein, but any liquid can be applied thereto as long as processing can be performed with it.

What is claimed is:

1. A solution processing apparatus, comprising:
   a processing solution rank to store a processing solution;
   a holder having an inner space to house a substrate and an opening for the substrate to be in contact with the processing solution;
   a holder raising and lowering mechanism to raise and lower said holder with respect to said processing solution tank;
   a substrate raising and lowering mechanism to hold the substrate housed in the inner space of said holder and raise and lower the substrate with respect to the holder;
   a first electrode which is placed in the inner space of said holder and configured to be in contact with the substrate;
   a second electrode between which and said first electrode voltage is applied;
   a pressurizing mechanism to raise pressure in the inner space of said holder; and
   a controller configured to control said substrate raising and lowering mechanism to raise the substrate with respect to the holder while said pressurizing mechanism raises pressure in the inner space of said holder.

2. The solution processing apparatus according to claim 1, wherein said pressurizing mechanism is a gas supplying mechanism to supply a gas to the inner space of said holder.

3. The solution processing apparatus according to claim 1, wherein the processing solution is a plating solution.

4. A solution processing apparatus, comprising:
   a processing solution tank to store a processing solution;
   a holder having an inner space to house a substrate and an opening for the substrate to be in contact with the processing solution;
   a holder raising and lowering mechanism to raise and lower said holder with respect to said processing solution tank;
   a substrate raising and lowering mechanism to hold the substrate housed in the inner space of said holder and raise and lower the substrate with respect to said holder, and rotate the substrate substantially in a horizontal plane;
   a first electrode which is placed in the inner space of said holder and configured to be in contact with the substrate;
   a second electrode between which and said first electrode voltage is applied;
   a fluid spraying mechanism to spray fluid to a contact portion of the substrate and said holder from an outside of said holder in a state in which said substrate is in contact with said holder; and
   a spray controller configured to control said substrate raising and lowering mechanism to rotate the substrate for which said solution processing is performed, and control said fluid spraying mechanism to spray the fluid to the contact portion of the substrate for which said solution processing is performed and said holder while the substrate for which said solution processing is performed is rotated.

5. The solution processing apparatus according to claim 4, wherein said fluid spraying mechanism is a gas spraying mechanism to spray a gas to said contact portion.

6. The solution processing apparatus according to claim 4, wherein said fluid spraying mechanism is a liquid spraying mechanism to spray liquid to the contact portion.

7. The solution processing apparatus according to claim 4, wherein the processing solution is a plating solution.

8. A solution processing apparatus, comprising:
   a processing solution tank to store a processing solution;
   a holder having an inner space to house a substrate and an opening for the substrate to be in contact with the processing solution;
   a holder raising and lowering mechanism to raise and lower said holder with respect to said processing solution tank;
   a first electrode which is placed in the inner space of said holder and configured to be in contact with the substrate;
   a second electrode between which and said first electrode voltage is applied; and
   a substrate raising and lowering mechanism to hold the substrate housed in the inner space of said holder, and raise and lower, and rotate the substrate with respect to said holder.

9. The solution processing apparatus according to claim 8, wherein the processing solution is a plating solution.

10. A solution processing method, comprising:
    a solution processing step of feeding an electric current to a substrate and performing solution processing for the substrate in a state in which the substrate is housed in an inner space of a holder so as to close an opening of said holder and the substrate is in contact with a processing solution;
    a processing solution separating step of separating the substrate for which said solution processing is performed from the processing solution after performing said solution processing for the substrate;
    a fluid spraying step of rotating the substrate for which said solution processing is performed and spraying fluid to a contact portion of the substrate for which said solution processing is performed and said holder from an outside of said holder after separating the substrate for which said solution processing is performed from the processing solution; and
    a holder separating step of separating the substrate from said holder after spraying the fluid thereto.

11. The solution processing method according to claim 10, wherein said fluid spraying step is a step of spraying a gas to the contact portion.

12. The solution processing method according to claim 10, wherein said fluid spraying step is a step of spraying liquid to the contact portion.

13. A solution processing method, comprising:
    a solution processing step of feeding an electric current to a substrate and performing solution processing for the substrate in a state in which the substrate is housed in an inner space of a holder so as to close an opening of said holder and the substrate is in contact with a processing solution;

a processing solution separating step of separating the substrate for which said solution processing is performed from the processing solution after performing the solution processing for the substrate;

a spin dry of rotating the substrate for which said solution processing is performed substantially in a horizontal plane so as to remove the processing solution from the substrate for which said solution processing is performed; and a holder separating step of separating the substrate for which said solution processing is performed from said holder while rotating the substrate for which said solution processing is performed with respect to said holder, after separating the substrate for which said solution processing is performed from the processing solution.

* * * * *